United States Patent [19]
Lingren

[11] Patent Number: 6,002,134
[45] Date of Patent: *Dec. 14, 1999

[54] CROSS-STRIP SEMICONDUCTOR DETECTOR WITH CORD-WOOD CONSTRUCTION

[75] Inventor: Clinton L. Lingren, San Diego, Calif.

[73] Assignee: Digirad Corporation, San Diego, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 08/955,474

[22] Filed: Oct. 21, 1997

Related U.S. Application Data

[63] Continuation-in-part of application No. 08/881,175, Mar. 23, 1997, abandoned, which is a continuation-in-part of application No. 08/542,883, Oct. 13, 1995, Pat. No. 5,677,539.

[51] Int. Cl.⁶ .................................................. G01T 1/24
[52] U.S. Cl. ................................ 250/370.01; 250/370.13
[58] Field of Search .................... 250/370.01, 370.09, 250/370.13, 370.14; 257/428

[56] References Cited

U.S. PATENT DOCUMENTS

| | | | |
|---|---|---|---|
| 3,761,711 | 9/1973 | Hall | 250/370 |
| 4,255,659 | 3/1981 | Kaufman et al. | 250/370.13 |
| 4,692,782 | 9/1987 | Seki et al. | 357/29 |
| 4,782,377 | 11/1988 | Mahan | 357/30 |
| 4,837,607 | 6/1989 | Kemmer et al. | 357/30 |
| 5,227,635 | 7/1993 | Iwanczyk | 250/370.12 |
| 5,391,882 | 2/1995 | Rhiger | 250/370.13 |

FOREIGN PATENT DOCUMENTS

| | | | |
|---|---|---|---|
| 62-293680 | 12/1987 | Japan | H01L 31/00 |
| 1-138486 | 5/1989 | Japan | G01T 1/24 |
| 2-105090 | 4/1990 | Japan | G01T 1/24 |

OTHER PUBLICATIONS

Hecht, K., "Zum Mechanismus des lichtelektrischen Primarstromes in isolierenden Kristallen", *Z. Physics*, vol. 77, at p. 235, 1932.

Zanio, K., et al., "Performance of CdTe as a Gamma Spectrometer and Detector," *IEEE Trans. Nucl. Sci.*, vol. 17, pp. 287–295, 1970.

Malm, H.L., et al., "Gamma–Ray Spectroscopy with Single –Carrier Collection in High–Resistivity Semiconductor", *App. Phys. Let.*, vol. 26, No. 6, pp. 344–346, Mar. 1975.

(List continued on next page.)

*Primary Examiner*—Edward P. Westin
*Assistant Examiner*—Richard Hanig
*Attorney, Agent, or Firm*—Fish & Richardson P.C.

[57] ABSTRACT

A cross-strip radiation detector for detecting ionizing radiation. The detector includes a semiconductor having at least two sides, a radiation side and an opposing signal collecting side. A plurality of parallel radiation-side electrode strips are formed on the radiation side of the semiconductor. Multiple of signal-collecting-side electrodes are formed on a signal collecting side of the semiconductor and are connected to form a plurality of parallel signal strips that are not parallel to the radiation-side electrode strips. For common semiconductors, anodes are used to detect the energy level of the ionizing radiation. The signals from the cathode strips are used in conjunction with the signals from the anodes to determine the location of an ionizing event. At least one additional electrode, a control electrode, may also be formed on the semiconductor to alter the electric field within the semiconductor to improve the collection efficiency of the signal electrode. A high-voltage decoupling circuit is implemented on the signal collecting side with high-voltage capacitors arranged in a cord-wood configuration to allow for all-side buttability. A thin circuit layer is formed on a lateral side of the semiconductor to transfer the signals from the radiation side to the signal collecting side. A shield electrode may also be formed on the signal collecting side and be capacitively coupled to the semiconductor to reduce the effect on the anodes of charge trapping in the semiconductor.

23 Claims, 21 Drawing Sheets

OTHER PUBLICATIONS

Malm, et al., "Single Carrier Charge Collection in Semiconductor Nuclear Detectors", *Revue de Physique Appliquee*, vol. 12, No. 2, Feb. 1977.

Zanio, K., "Use of Various Device Geometry to Improve the Performance of CdTe Detectors", *Revue de Physique Appliquee*, No. 12, Feb. 1977.

Gatti, E., et al., "Semiconductor Drift Chamber—An Application of a Novel Charge Transport Scheme", *Nucl. Instruments and Methods in Physics Research*, 225, pp. 608–614, 1984.

Richter, M., et al., "High Resolution Gamma Ray Spectroscopy with CdTe Detector System", *Nucl. Instruments and Methods in Physics Research*, A322, pp. 529–537, 1982.

Doty, F.P., et al., "Pixellated CdZnTe Detector Arrays" *Nucl. Instruments and Methods in Physics Research*, A00, 1994.

Jalas, P., et al., "New Results in Semiconductor Drift Chambers for X–Ray Spectroscopy", *IEEE Trans. Nucl. Sci.*, vol. 41, No. 4, p. 148, Aug. 1994.

Luke, P.N., "Unipolar Charge Sensing with Coplanar Electrode—Application to Semiconductor Detectors", *IEEE Trans. Nucl. Sci.*, vol. 42, No. 4, pp. 207–213, 1995.

Barrett, H.H., et al., "Charge Transport in Rays of Semiconductor Gamma–Ray Detectors", *Physical Review Letters*, vol. 75, No. 2, pp. 156–159, Jul. 3, 1995.

Ivanov, V.I., "Spectrometric Characteristic Improvement of CdTe Detectors," *IEEE Trans. Nucl. Sci.*, vol. 42, No. 4, pp. 258–262, Aug. 1995.

CROSS-STRIP SEMICONDUCTOR DETECTOR WITH CORD-WOOD CONSTRUCTION

CROSS-REFERENCE TO RELATED APPLICATIONS

This application is a continuation-in-part of U.S. patent application Ser. No. 08/881,175, filed on Jun. 23, 1997, now abandoned which is a continuation-in-part of U.S. patent application Ser. No. 08/542,883 filed on Oct. 13, 1995, now U.S. Pat. No. 5,677,539.

BACKGROUND

1. Field of the Invention

This invention relates to a device for detecting ionizing radiation, and more particularly to a cross-strip semiconductor radiation detector.

2. Description of Related Art

Energy can be absorbed into a semiconductor material to induce ionization which generates electrons and holes. Since the number of pairs of electrons and holes has a dependence on the absorbed energy, the measurements of the total generated charges can be used to determine the energy. The energy may be originated from different ionizing radiation sources, including but not limited to, particulate radiation, such as alpha or beta particles, and electromagnetic radiation, such as gamma or x rays. Ionization forms the basis of many semiconductor detectors for measuring electromagnetic energy or detecting particles.

High-resistivity semiconductor radiation detectors are widely used for detecting ionizing radiation due to their ability to operate at room temperature, their small size and durability, and other features inherent in semiconductor devices. Such detectors are used in a wide variety of applications, including medical diagnostic imaging, nuclear waste monitoring, industrial process monitoring, and space astronomy. Ionizing radiation includes both particulate radiation, such as alpha or beta particles, and electromagnetic radiation, such as gamma or x rays.

One conventional semiconductor radiation detector is generally referred to as "planar" detector which is constructed by respectively forming two planar electrodes on two opposing facets of a semiconductor slab. The two electrodes are applied with different electrical potentials to produce an electrical field within the semiconductor slab. This electrical field forces the radiation-induced electrons and holes to migrate in opposite directions towards the respective electrodes, i.e., the electrons to the electrode with higher potential and holes to the electrode with lower potential. As shown in FIG. 1, the architecture of a planar detector 100 typically consists of a slab of semiconductor crystal 102 with metal covering two opposing surfaces of the slab to form two electrodes, a cathode 104 and an anode 106. In one configuration, the anode 106 is connected to external signal conditioning circuitry 108 and to ground 110, and the cathode 104 is connected to an external voltage source 111. A bias voltage across the electrodes 104, 106 creates an internal electric field. Electron and hole "charge clouds" generated within the semiconductor crystal 102 by an ionizing radiation 112 absorbed within the slab of semiconductor crystal 102 are swept toward the anode 106 and cathode 104 electrodes, respectively. These moving electron and hole clouds create charge-pulse signals in the external signal conditioning circuitry 108.

If all the electrons and holes generated by the ionizing radiation 112 reach their respective electrodes (i.e., the electrons reach the anode 106 and the holes reach the cathode 104), the output charge signal will exactly equal the charge from the energy deposited within the crystal 102. Because the deposited charge is directly proportional to the energy of the ionizing radiation 112, the semiconductor radiation detector 100 provides a means for measuring the energy of the ionizing radiation 112. The ability to measure this energy is an important function of radiation detectors.

Planar radiation detectors, however, suffer from a serious drawback: because of limitation in the transport properties of the bulk semiconductor crystal 102, some of the electrons and holes are generally lost by being trapped as they sweep toward their respective electrodes. Thus, the amplitude of the output charge signal becomes dependent on the position within the crystal at which the ionizing radiation is absorbed. Generally, the amplitude is less than the charge deposited by the ionizing radiation 112, resulting in a corresponding reduction of energy measurement accuracy as well as poor resolution and reduced peak efficiency. This loss (or trapping) of charge in a radiation detector results in asymmetrical spectral peak shapes known as "low-energy tailing."

As stated above, in a semiconductor radiation detector, when an ionizing event occurs, electrons are swept toward the anode 106 and holes toward the cathode 104. In a typical experimental arrangement, with the cathode 104 facing the source of the radiation, many ionization events occur over some accumulation period, and the resulting charge signal pulses are detected and then displayed in a histogram. In an ideal detector, in which there is no low-energy tailing, all the pulses would be directly proportional to the energy of the ionizing radiation 112. This would result in a histogram like that of FIG. 2, in which counts per channel are plotted versus charge signal pulse amplitude. As can be seen in FIG. 2, the energy histogram exhibits no tailing, because the energy peak (or "photopeak") 202 appears as a straight vertical line at a single energy level, E, equal to the energy level of the ionizing radiation 112. Thus, all the charge signal pulses have an amplitude equal to the energy level E of the ionizing radiation 112, and no charge is lost in any single pulse.

Curves A and B of FIG. 3 illustrate two idealized cases of low-energy tailing in a non-ideal detector. Curve A represents the histogram distribution that would result if the ionizing radiation were absorbed uniformly throughout the crystal, as would occur with a very low absorption coefficient of the crystal. Curve B represents the more typical situation, where absorption is large near the cathode and drops off exponentially as the ionizing event moves in a direction away from the cathode within the crystal. In both Curves A and B, there is a maximum signal 302 corresponding to full charge collection (at amplitude "E") and pronounced low-energy "tails" 304, 306.

FIG. 4 shows an energy histogram exhibiting pronounced low-energy tailing for an actual semiconductor radiation detector made from Cadmium-Zinc-Telluride (CdZnTe) irradiated with gamma rays from a cobalt-57 ("$^{57}$Co") radiation source. This detector had area dimensions of 6.1 mm by 6.1 mm and a thickness of 3 mm. Its bias voltage was −500 Volts. The data values in FIG. 4 are spread-out by electronic noise, an effect that was not considered in plotting the idealized curves of FIG. 3. As with Curves A and B of FIG. 3, the histogram of FIG. 4 has a pronounced low-energy tail 404.

Because of the deleterious effects of low-energy tailing in semiconductor detectors, much effort has gone into attempting to solve this problem. One approach to reducing the tailing effect in semiconductor detectors is to reduce the dependence of the signal pulse-charge amplitude on the position at which the ionizing radiation is absorbed. This can be accomplished, in principle, by contriving to limit to a small distance the region in which charge is induced on one electrode by a charge cloud in front of that electrode. If this is accomplished, a charge cloud generated by an ionizing event induces little charge on the electrode until it becomes very near the electrode, after which the charge cloud induces essentially all of its charge on that electrode. This approach is especially useful for semiconductors in which the transport properties of one carrier type (e.g., electrons) are much better than those of the other type (holes in this example). These transport properties are expressed by a "mobility-lifetime product." The ratio of the transport properties of one type carrier (e.g., holes) to those of the other type carrier (e.g., electrons) is expressed as the "mobility-lifetime-product ratio." Thus, the general approach described above is useful for all mobility-lifetime-product ratios, but is most useful for semiconductors having a large ratio of the larger mobility-lifetime product divided by the smaller. Semiconductors for which the mobility-lifetime-product ratio is greater than 10 include cadmium-zinc-telluride, cadmium-telluride, and mercury-iodide.

An early effort aimed at minimizing low-energy tailing using the above approach employed a semiconductor detector having a hemispherical configuration. See, e.g., H. L. Malm, et al., "Gamma-Ray Spectroscopy with Single-Carrier Collection in High Resistivity Semiconductors," Appl. Phys. Lett., vol. 26, at 344–46 (1975). In Malm's detector, a large hemispherical surface of the cadmium-telluride was metallized to form the cathode. The anode formed a small circle at the center of the flat cross-section of the hemisphere. A bias voltage applied across these electrodes produced an internal electric field that varied from a low value near the cathode to a high value near the small anode. The electric field lines were thus concentrated near the central point by the spherical geometry. A result of this electric field concentration is that electrons move much faster in the close vicinity of the anode than in the remainder of the detector. Because the charge induced on the anode is inversely proportional to the square of the distance from the charge cloud to the anode, most of the charge is induced when the charge cloud is in the vicinity of the anode. The signal charge pulse amplitude is thus relatively insensitive to the position of the ionizing event in the detector.

The Malm approach, however, has several disadvantages. First, while energy resolution is improved over the planar detector, significant tailing remains. Second, it is difficult and thus costly to fabricate a semiconductor crystal having a hemispherical configuration. Third, the configuration cannot be applied to monolithic detector array structures. In consequence, this detector has achieved little, if any, commercial acceptance.

A second approach achieves a reduction in tailing by using a planar structure in which the anode is in two sections, a 0.5 mm diameter circle and a ring surrounding and at the same voltage as the circle, and the cathode covers the opposite surface. See, e.g., F. P. Doty, et al., "Pixilated CdZnTe Detector Arrays," Nucl. Instruments & Methods in Physics Research, vol. A 353, at 356–60 (1994). The charge induced by an electron cloud is shared between the small circle and the ring, such that the charge induced on the circle is very small until the charge comes very close to the circle. The full charge is then induced on the circle within a distance comparable to the detection element dimensions.

This second approach also suffers from a significant disadvantage, in that it results in a very low collection efficiency. This result stems from the fact that only charge clouds directly above the small anode are collected.

A third approach employs a structure in which the anode of a planar CdZnTe detector is segmented into an array of very small individual detectors (detection elements), with the cathode remaining as a single, continuous electrode. See H. Barret, et al., "Charge Transport in Arrays of Semiconductor Gamma-Ray Detectors," Phys. Rev. Let. (In Press). Here, each detection element is connected to an external signal conditioning circuit. Charge induced by an electron cloud is shared among the detection elements and is very small on any specific detection element until the charge is very near the detection element.

This third approach also suffers from significant limitations. First, it is only useful for an array of very small detection elements. Thus, this approach cannot be used for single-element detectors. Second, this approach is not applicable to detector arrays with detection element sizes of a millimeter or more, as used in nuclear medical imagers.

A fourth approach employs an anode patterned into an interleaved grid structure, with the cathode remaining planar. See, e.g., P. N. Luke, "Unipolar Charge Sensing with Co-Planar Electrodes—Application to Semiconductor Detectors," IEEE Tran. Nucl. Science, vol. 42, No. 4, at 207–213 (1995). In the Luke approach, one set of anode grids is maintained at a slightly higher voltage than the other. A train of signal conditioning electronics is connected to each set of grids, and the difference between the outputs from these trains constitutes the final output signal. With this arrangement, when the charge cloud is far from the grids, the difference-signal between the grid outputs is zero. As the cloud approaches the grids, the induced charge on one grid rises rapidly, while the charge induced in the other grid drops rapidly. The difference signal is then a measure of the full charge in the electron cloud, independent of the position of the ionizing event.

The Luke approach, however, also suffers from drawbacks. First, the grid structure is relatively complex and would be difficult, if not impossible, to use in detector arrays. Second, the grids require two separate amplifying chains, plus a difference amplifier, which add significantly to the complexity and cost of manufacture. This circuitry would also be very difficult to implement in multi-channel integrated circuits needed in detector array structures.

A final approach to reducing low-energy tailing may be implicit in the design of silicon drift chambers. See, e.g., E. Gatti & P. Rehak, "Semiconductor Drift Chamber—An Application of a Novel Charge Transport Scheme." Nucl. Inst. & Methods in Physics Research, vol. 225, at 608–614 (1984). A semiconductor drift chamber is based on the principle that a thin, large area semiconductor wafer, with rectifying junctions implanted on both surfaces, can be fully depleted through a small anode contact. The depletion field confines electrons generated by an ionizing particle in a buried potential channel parallel to the surface. An electrostatic field (drift field) parallel to the surface is independently superimposed and transports the electrons along the buried potential channel toward a collecting electrode. In addition, the capacitance of the collecting electrode is very low and independent of the active area of the detector. It has been suggested that drift chambers can be made from a variety of semiconductors. They have been implemented successfully with 300-micron-thick high-resistivity ($10^4$ to $10^5$ ohm-cm) silicon wafers. Such drift chambers are used as high-resolution position-sensing detectors for particle physics.

The silicon drift chamber approach also suffers from several drawbacks. First, rectifying junction contacts must be used to generate the depletion field and the drift field. Because of the limitation of the breakdown voltage of these junction contacts, the magnitude of usable voltage is limited. This in turn limits the thickness of the wafer that can be used for the drift detector. Second, in order to transport charge effectively in the thin channel, a uniform drift field must be applied. A large number of junction contacts, each with a carefully controlled, fixed voltage, is required on the wafer to generate this uniform drift field. This adds significantly to the manufacturing cost and the complexity of using the detector. Third, because of the limitation of the thickness of the detector and the low Z (~14) of the semiconductor material used, the detection efficiency for x rays and gamma rays is very low for energies above 10–20 KeV.

Both silicon detectors and detectors made of high resistivity materials, such as CdTe and CdZnTe, have employed "guard rings" around the signal electrode. A guard ring is normally kept at the same potential as the signal electrode and is used primarily to prevent dark current from the edge of a detector from reaching the signal electrode, thereby reducing the signal-to-noise ratio of the measurement. The guard ring does not significantly reduce low-energy tailing encountered in semiconductor detectors.

However constructed, multiple semiconductor detectors may be used to form an array. It has been recognized that semiconductor detector arrays are potentially attractive for nuclear medicine imaging because of their very small size and weight, excellent spatial resolution, direct conversion of gamma photons into electrical signals, capability of on-board signal processing, high stability, and reliability. See, e.g., U.S. Pat. No. 5,132,542; IEEE Transactions on Nuclear Science, Vol. NS-27, No. 3, June 1980, "Semiconductor Gamma Cameras in Nuclear Medicine;" and IEEE Transactions on Nuclear Science, Vol. NS-25, No. 1, February 1978, "Two-Detector, 512-Element, High Purity Germanium Camera Prototype."

An imaging array may be formed by different array architectures. One conventional approach constructs an array on a single semiconductor crystal slab by forming a continuous electrode on one side of the slab and an array of electrodes on the opposing side. The continuous electrode is shared by all detection elements. The excitation voltage, typically several hundred volts, may be applied to the continuous electrode and each of the signal electrodes may be held at near ground potential. Each individual electrode on the array side is connected to a processing circuit for conditioning and measuring the signals. Thus a N-element array would have N processing channels.

Another conventional approach uses a "cross-strip" architecture. Multiple mutually parallel conducting strips are formed on each of the two opposing surfaces of a semiconductor slab. The two sets of parallel-strip electrodes are orthogonal to each other. Electronics are connected to each strip and coincident signals are identified. When a photon (or a particle) is absorbed in the array, a signal appears on a strip on each side of the slab at where the photon hits. The location is determined by the intersection of the two strips that produces a simultaneous signal. The cross-strip architecture may only need one processing channel for each strip and therefore significantly reduces complexity and number of electronic components of the detector.

One example of a cross-strip semiconductor gamma camera is described in U.S. Pat. No. 4,292,645, to Schlosser, et al. Schlosser teaches an improved technique for providing the necessary electrical contact to doped regions of a semiconductor gamma detector principally comprised of germanium. A layer of resistive material makes contact with conductive strips on a detector surface, and two readout contacts at the sides of the resistive layer, parallel to the strips and connected to two amplifiers, allow identification of the strip where a gamma ray is absorbed. The opposite side of the detector is arranged the same except that the strips are orthogonal to those on the other side. Two amplifiers for the top surface and two amplifiers for the bottom surface handle all events in the entire imager.

Another example of a cross-strip semiconductor gamma-ray-imaging system is described in Materials Research Society Symposium Proceedings, Vol. 302 (Materials Research Society, Pittsburgh, 1993), pp. 43–54, "Multi-Element Mercury Iodide Detector Systems for X-Ray and Gamma-Ray Imaging," by Bradley E. Patt. Orthogonal strips on opposite sides of a semiconductor crystal define the detection elements. One amplifier is used for each strip. The coincidence of signals from orthogonal strips is used to define the position at which a gamma ray is absorbed within the crystal. Such cross-strip imaging arrays may be used to achieve sub-millimeter resolution. Mayer et al. reported a spatial resolution of about 0.2 mm by using a 1.5 mm thick, 64×64 orthogonal strip CdZnTe detector of 0.375 mm pitch in both dimensions. See, Mayer et al., "Performance of CdZnTe Strip Detectors as Sub-Millimeter Resolution Imaging Gamma Radiation Spectrometers," IEEE Transaction on Nuclear Science, Vol. 44, No. 3, pp. 922, June, 1997.

Therefore, a need exists for a semiconductor radiation detector that minimizes low-energy tailing and that obviates the disadvantages and drawbacks of conventional radiation detectors. The present invention provides such a radiation detector.

SUMMARY

The invention is a device and method for detecting ionizing radiation emanating from a source. The ionizing radiation may be high energy photons, including gamma rays and x-rays, or charged particles, including beta particles and alpha particles. It should be recognized, however, that the invention may be used in detecting any kind of ionizing radiation.

The invention takes advantage of the principle that a significant reduction in low-energy tailing in a semiconductor detector can be attained by a novel arrangement of electrodes that share induced charge from ionizing events in the detector, that properly shape the electric field, and that focus charge collection toward a small electrode. In implementing a semiconductor radiation detector that follows this principle, the invention employs a detector structure having a novel arrangement of three electrodes that virtually eliminates tailing while maintaining high collection efficiency.

In accordance with the invention, a radiation detector is provided that is capable of detecting energies from a few KeV to several hundred KeV. The detector includes three electrodes formed on the surface of a semiconductor crystal. The crystal has a plurality of sides; it preferably has a thickness of at least about 0.5 mm and is preferably formed from a semiconductor material having a high mobility-lifetime ratio. The first electrode is a bias electrode, which preferably covers the entire surface of one side of the crystal. At least one signal electrode having a small area is preferably formed on the opposing side of the crystal from the bias electrode. A control electrode is preferably disposed on the same side containing the signal electrode.

More particularly, in the invention, the control electrode is formed on the same side of the semiconductor crystal as the signal electrode (or anode), and the bias electrode (or cathode) covers substantially the entire surface of the opposite side of the crystal. Preferably, the semiconductor crystal is formed from CdZnTe or CdTe. In the simplest configuration, an anode is a small contact point located near the center of the electron-charge-collection side of the crystal. The anode is coupled to ground through a relatively large resistance and to external signal circuitry. The cathode is coupled to a voltage source that maintains the cathode at a negative voltage level relative to the anode. Preferably, the control electrode is much larger in area than the anode and forms a single ring surrounding the anode. The control electrode is maintained at a voltage level that is negative with respect to the anode, but generally not more negative than the cathode. Additional shielding electrodes may be implemented to separate and improve the charge-shielding and field shaping functions of the control electrode.

In accordance with another aspect of the invention, cross-strip detectors may be formed by using a multiple-electrode configuration for each detection element to achieve improved detection resolution and collection efficiency over conventional cross-strip detectors. A multiple-electrode configuration may include at least one additional electrode disposed relative to a cathode and anode to effect shielding of induced charges or carrier focusing. In particular, a cord-wood construction may be used to implement a high-voltage-signal decoupling circuitry that stacks upon the signal electrode array. This configuration provides "all-side" buttablility with minimized dead area between two adjacently interfaced detectors.

The details of the preferred embodiment of the invention are set forth in the accompanying drawings and the description below. Once the details of the invention are known, numerous additional innovations and changes will become obvious to one skilled in the art.

BRIEF DESCRIPTION OF THE DRAWINGS

Like reference numbers and designations in the various drawings refer to like elements.

DETAILED DESCRIPTION

The invention will be described in detail with reference to specific embodiments. It should be understood, however, these embodiments are exemplars to illustrate the implementation of the invention and should not be construed as limitations thereof. In addition, many aspects of the present invention are disclosed in the copending U.S. patent application Ser. No. 08/881,175, filed on Jun. 23, 1997 and U.S. patent application Ser. No. 08/542,883, filed on Oct. 13, 1995, both of which are incorporated herein by reference in their entirety.

Figure 5A:
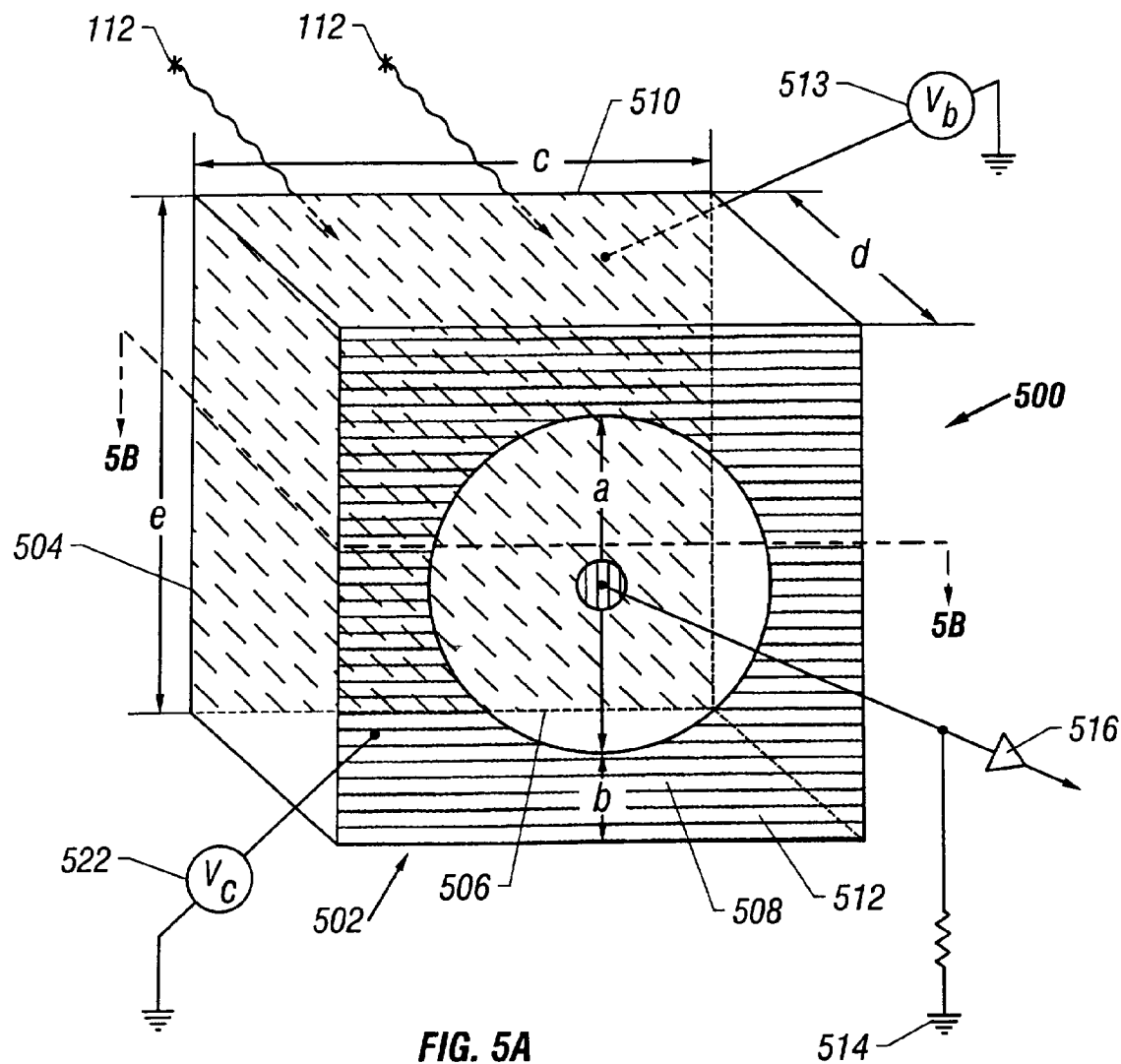
FIG. 5A is a perspective view of a single detection element having a 3-electrode configuration.

Radiation Detector with Shielding and Control Electrodes (1) 3-Electrode Radiation Detector FIG. 5A is a perspective view of the preferred embodiment of a single-element radiation detector 500 of the invention. While a single-element detector is shown, it should be understood that the detector of the invention is not limited to the single-element embodiment and can be used in any multi-element configuration. Thus, a number of single-element detectors 500 can be grouped together to form an array of single-element detectors, or, in accordance with the principles of the invention, a monolithic detector array can be fabricated.

The single-element detector 500 of FIG. 5A is preferably capable of detecting energies in the range from a few KeV to over 1 MeV. The detector 500 includes a semiconductor crystal 502, a bias electrode 504, a signal electrode 506, and a control electrode 508. Appropriate biasing of the electrodes creates an electric field within the crystal 502. Ionizing radiation 112 absorbed in the detector 500 causes ionizing events within the crystal 502. The ionizing events, in turn, result in charge clouds that are guided by the electric field toward the signal electrode 506.

For the following discussion, it is assumed that the mobility-lifetime product for electrons is greater than for holes. For the reverse condition, in which the mobility-lifetime product for holes is greater than that for electrons, electric polarity would also be reversed.

(A) The Semiconductor Crystal

The semiconductor crystal 502 is a slab or wafer of high-resistivity, high Z (greater than about 34) semiconductor material. Preferably, the crystal consists of a slab of high-resistivity CdZnTe, which can operate at room temperature and can be fabricated into detectors. Alternatively, the crystal 502 may be formed from CdTe, $HgI_2$, PbI, or other semiconductor materials that have high-resistivity and that can be fabricated into detectors. Of course, those skilled in the art will recognize that virtually any semiconductor material may be used in the invention.

When used in a spectroscopic mode, detectors made from CdZnTe or CdTe yield many lower-energy pulses in addition to the characteristic pulse amplitude for any particular energy of ionizing radiation. That is, such crystals produce significant low-energy tailing. Thus, it is especially important in radiation detectors in which the semiconductor slab is fabricated from CdZnTe or CdTe to design the detector in such a way that minimizes tailing. The invention provides a detector structure that virtually eliminates tailing and thus is particularly well-suited to CdZnTe and CdTe-based semiconductor radiation detectors.

As shown in FIG. 5A, the semiconductor crystal 502 is preferably a rectangular parallelepiped. The crystal 502 may, however, have virtually any desired volumetric shape, including cubic, hemispherical, cylindrical, conic, or rhombic. In one experimental embodiment, the crystal 502 was square on sides 510 and 512, with dimensions "c" and "e" each being about 6.1 mm, and with a thickness "d" of about 3 mm. It should be understood, however, that the dimensions of FIG. 5A are merely exemplary and that the dimensions depend primarily on the application in which the detector is being used and on the measurement conditions. Thus, the crystal 502 may have a smaller or larger surface area on sides 510 and 512. Typically, the surface area of the sides 510, 512 ranges from about one to several hundred square millimeters.

The crystal 502 may have a thickness "d" of greater or less than 3 mm. Preferably, however, the thickness is greater than about 0.5 mm, with the typical range being between approximately 1 mm and 10 mm. (The effect of varying the thickness of the crystal 502 will be described in greater detail below.) Those skilled in the art will recognize that the crystal shape and dimensions may be varied alone or in combination to achieve special performance results or to improve manufacturability.

The novel structure of the invention can be used with virtually any semiconductor or insulating detector material having a resistivity greater than about 10 megohm-cm. If the semiconductor resistivity is less than 10 megohm-cm, the resistivity may be effectively increased to this value by creating a Shottky barrier or p-n junction at one of the electrodes.

(B) The Bias Electrode

The bias electrode 504 is formed as a conductive layer (e.g., by metallizing) on substantially the entirety of the surface of side 510 of the crystal 502. (In the embodiment shown in FIG. 5A, the ratio of the electron mobility-lifetime product to the hole mobility-lifetime product is greater than 1, and the bias electrode 504 thus acts as a cathode and will be referred to as such for the remainder of this description. Of course, if the mobility-lifetime ratio were reversed, the polarity would be reversed, and the cathode 504 would act as an anode.) The cathode 504 may be formed to cover only a portion of a surface of the crystal 502, or to cover more than one surface, and/or several cathodes may be provided on side 510. Further, the cathode 504 may be formed in different shapes and with various dimensions.

The cathode 504 is set to a bias (or cathode) voltage, $V_b$, which is negative with respect to the anode 506, and which depends on the thickness "d" of the crystal 502 and on the application. For the preferred embodiment, in which the crystal 502 is about 3 mm thick, the magnitude of $V_b$ may be from about −200 volts to about −1000 volts, and more preferably about −400 volts to about −500 volts. It should be understood, however, that $V_b$ may be any suitable voltage level. The cathode may be set to $V_b$ by coupling the cathode 504 to a constant external voltage source 514, or by any other suitable means for establishing and maintaining a substantially constant voltage level. Preferably, the cathode 504 is coupled to the voltage source 513 via a wire conductor.

(C) The Signal Electrode

In the embodiment of FIG. 5A, the signal electrode 506 is preferably a small conductive contact located at or near the center of side 512, which is the surface of the semiconductor crystal 502 opposing the side 510 on which the cathode 504 is formed in the preferred embodiment. (As explained above, in the embodiment of FIG. 5A, the electron mobility-lifetime product is greater than the same product for holes, and the signal electrode 506 thus acts as an anode and will be referred to as such for the remainder of this description. If the reverse were true, the polarity would be reversed, and the anode would act as a cathode.) The anode 506 of FIG. 5A has a circular shape with a diameter of about 1 mm, the diameter being less than dimension "a." Preferably, the anode 506 is a "dot" contact formed on the surface of side 512. Nevertheless, like the cathode 504, the anode 506 may be formed in a variety of shapes, such as a circle or polygon, and is not fixed dimensionally.

The anode 506 is coupled to external signaling circuitry 516, preferably via a wire connection, and via a resistor to an anode potential, which in the preferred embodiment of FIG. 5A is ground 514. Therefore, the anode 506 is at a more positive voltage level, $V_a$, than the cathode 504, which, as described above, is set to a more negative voltage. Consequently, a bias voltage exists across the anode 506 and cathode 504 which creates an electric field within the crystal 502. $V_a$ need not be at ground. Rather, $V_a$ may be any voltage level, provided, however, that $V_a$ and $V_b$ are set to different levels in order to establish a bias voltage between the cathode 504 and anode 506.

(D) The Control Electrode

Figure 6:
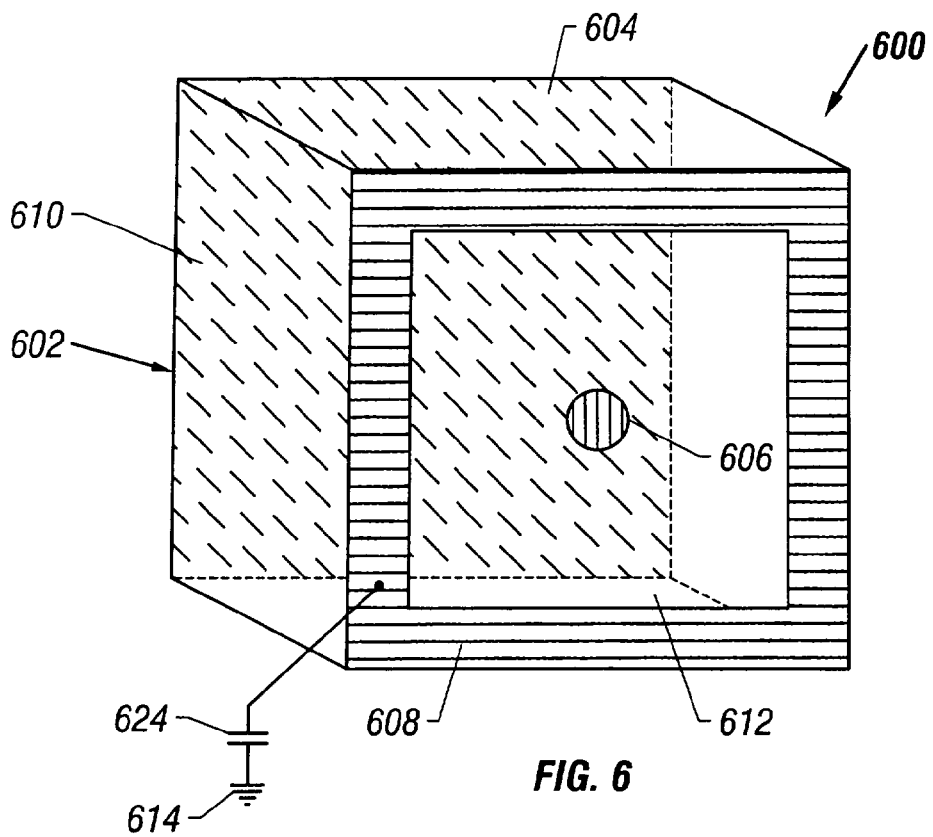
FIG. 6 is a perspective view of an alternative embodiment of the 3-electrode configuration.

A third electrode, the control electrode 508, is formed on the same side 512 of the crystal 502 as the anode 506 in the preferred embodiment. As shown in FIG. 5A, the control electrode 508 may be in the form of a conductive circular ring surrounding the anode 506, having an inside diameter, "a", of about 4 mm and an outside dimension, "a"+"2b", of about 6 mm. FIG. 6 shows an alternative embodiment of a radiation detector 600 of the invention, where the control electrode 608 forms a rectangular ring at the perimeter of side 612, with the ring surrounding the anode 606. In radiation detector 600, the control electrode 608 has a width of about 0.5 mm. As defined herein, "ring" means a body or structure having any shape (for example, circular or polygonal) that fully or partially encloses or substantially surrounds another body or structure. Thus, it should be understood that the control electrode 508 is not limited to a circular or rectangular ring around the anode 506, as shown in FIGS. 5A and 6, but may be in the shape of a square, triangle, or other ring shape. Moreover, the control electrode 508 need not fully surround the anode 506. Instead, the control electrode 508 may be an "incomplete" circle or square (rather than a complete ring) or an irregular area formed adjacent to the anode 506. Some alternative control electrode/anode configurations are described in detail below.

The area of the control electrode 508 should be substantially larger than the area of the anode 206 in order to "shield" the anode 506 from the hole-induced charge. The physics of electromagnetism dictates that the amount of charge induced by a charge on a finite conducting surface increases with the surface area. Thus, by increasing the area of the control electrode 508 and decreasing the area of the anode 506, the portion of the induced charge on the control electrode increases while the portion of the induced charge on the anode decreases. The control electrode 508 shields the induced charge from the anode 506. This shielding effect substantially reduces the low-energy tailing effect and improves the photo peak efficiency and the detection resolution.

To increase the shielding, the ratio of the total area of other electrodes including the control electrode 508 to the area of the anode 506 should be as large as possible. In the example of the circular ring control electrode in FIG. 5A, the gap between the anode and the control electrode should be as small as possible provided that proper electrical insulation is maintained between the two electrodes without pulse breakdown noise. An important aspect of the invention is recognition of that the shielding effect of the control electrode 508 diminishes as a carrier approaches the anode 506. The shielding in this case can be improved by forming the control electrode 508 in a close proximity to the anode 506. The potential difference between the anode 506 and the control electrode 508 and the voltage breakdown characteristics of the materials (including air) between the two electrodes 506 and 508 determines how close they can be located to each other.

In general, the control electrode 508 may be set at any potential for purpose of shielding. For example, the potential of the control electrode 508 may be the same as that of the anode 506 (e.g., at ground), or may be some other constant voltage level, or may be a controlled or completely variable voltage level. The control voltage, $V_c$, may also be held at a level less than the potential of the anode, $V_a$, in order to provide a focusing mechanism in addition to the shielding. Since $V_c < V_a$, the local electrical field between the control electrode and the anode directs electrons to the anode from the control electrode. This electrical field guides or "focuses" electrons near the control electrode to the anode. Hence, this focusing mechanism of the control electrode further enhance the collection efficiency of the anode 506. The control electrode 508 may be also maintained at a control voltage, $V_c$, which lies between the magnitudes of $V_b$ and $V_a$. For many applications the maximum detector sensitivity may be achieved at $V_c = V_b$.

$V_c$ may be established in a variety of ways. For example, as shown in FIG. 5A, the control electrode 508 may be coupled to an external voltage source 522 generating a substantially constant voltage. The voltage source 522 is used to maintain the control electrode 508 at $V_c$. When the external voltage source 522 is used to establish $V_c$, current flows into or out of the control electrode 508, depending on whether the potential is greater or less than the potential that would be established by the effective resistances from the control electrode to both the anode and cathode.

Alternatively, as shown in FIG. 6, the control electrode 608 may be coupled to a capacitor 624, which is in turn connected to ground 614. The capacitor 624 can be of any type, including a discrete, monolithic, thick film, or integrated circuit capacitor, or the capacitor 624 can be the parasitic capacitance of the system. The capacitor 624 charges to a voltage determined by $V_b - V_a$ and by the values of the inherent electrical resistances from the cathode 604 to the control electrode 608 and the control electrode 608 to the anode 606. The capacitor 624 prevents $V_c$ from changing significantly as charge is swept past the control electrode 608 during signal-charge collection.

In still another alternative embodiment, $V_c$ (and $V_a$ and $V_b$, for that matter) can be established by applying an AC voltage using, for example, voltage source 522. Similarly, $V_a$, $V_b$, and/or $V_c$ can be established by applying a digital step waveform or other waveform. By applying such variable voltage sources, $V_c$ can be modulated or actively varied to modulate or vary the output count rate of charge signal pulses at the anode 506.

In the illustrated radiation detectors 500 (FIG. 5A) and 600 (FIG. 6), the position and dimensions of the control electrodes 508, 608 are such that, with only a small capacitor (e.g., about 1000 pF) attached to the control electrodes 508, 608, the control electrodes can be maintained at about −250 volts, which is an acceptable operative value of $V_c$ when $V_b$ is about −500 volts. Thus, although the various embodiments of the radiation detector of the invention each require three electrodes, the addition of capacitor 624 to any one of the detector embodiments allows the detector to be operated as a two-terminal device with respect to external circuitry. Alternatively, the control electrodes 508, 608 and cathodes 504, 604 may be connected together, and the detectors 500, 600 can be operated as a two-terminal device with respect to external circuitry, with $V_c$ equal to $V_b$. Moreover, as will be described in more detail below, with the control electrodes 508, 608 held near an optimum $V_c$, nearly all electron charge clouds in the semiconductor crystal 502, 602 are collected by the anodes 506, 606. Thus, nearly all low-energy tailing is eliminated, and the detection efficiency is very high. The control electrodes 508, 608 also minimize effects from defects in the edges of the semiconductor crystal 502, 602.

(E) Electrode Configurations and Features

Figure 7:
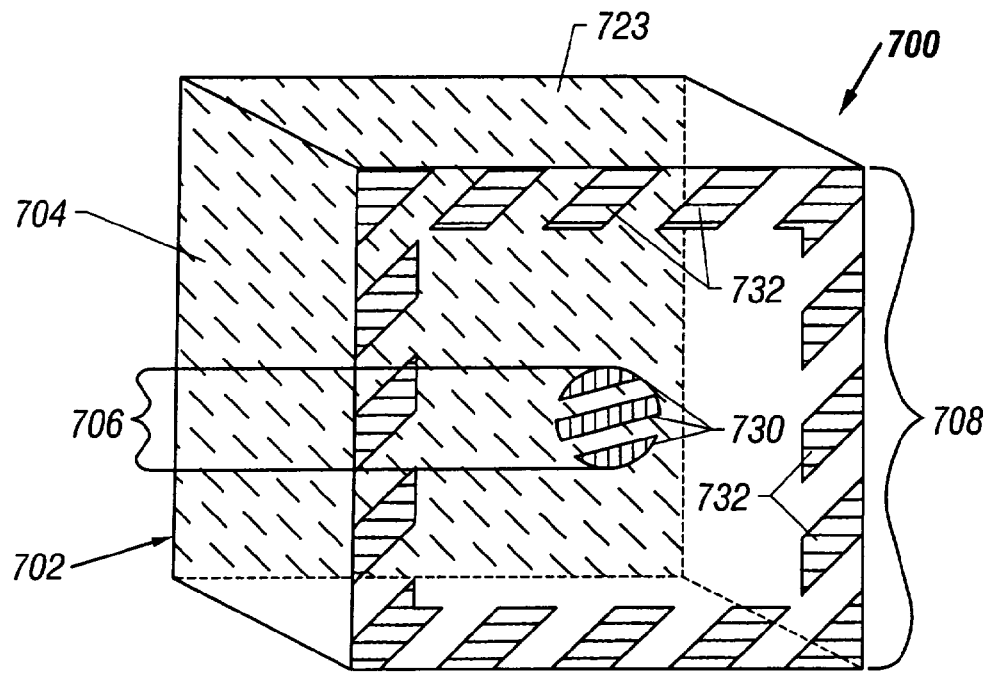
FIG. 7 is a perspective view of a detector element having segmented control electrodes.

FIG. 7 illustrates an alternative embodiment of the invention having a segmented anode 706 and control electrode 708. The anode 706 of FIG. 7 is segmented into a plurality of segments 730, and the control electrode 708 is also segmented into a plurality of segments 732. Both the anode 706 and control electrode 708 may have any number of segments 730, 732, and the segments may take virtually any shape. Moreover, all of the segments 730, 732 of a single anode 706 or control electrode 708 need not have the same shape or the same dimensions. Each segment in a single electrode, therefore, may have its own shape and size. The different segments 730, 732 may be set at different voltages in order to optimize the electric field distribution within a semiconductor crystal 504. Those skilled in the art will recognize that, through simulation and/or experimentation, such optimizing voltages can be selected empirically.

Figure 8:
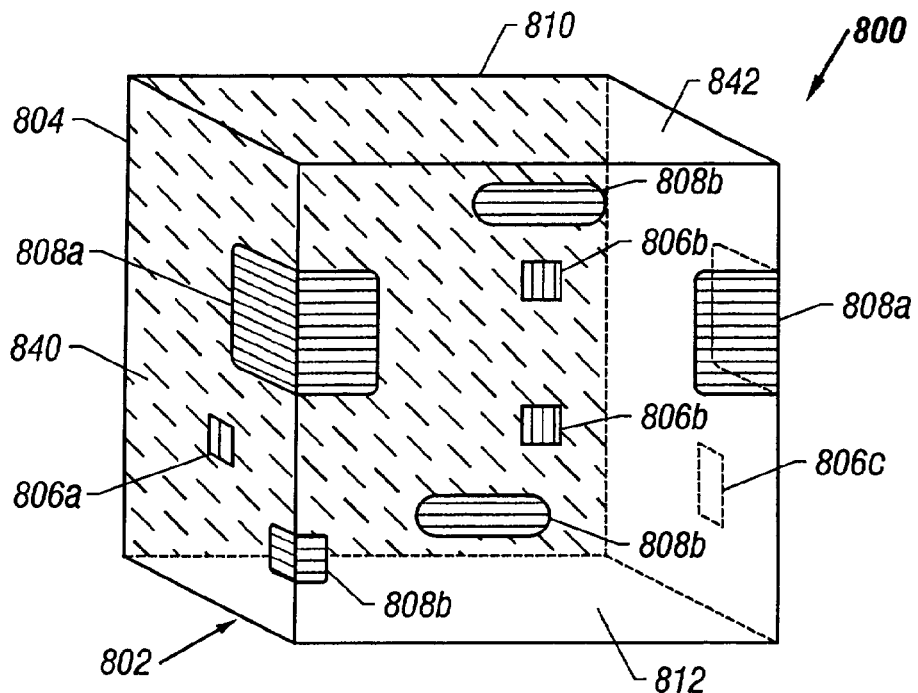
FIG. 8 is a perspective view of a detector element having multiple control electrodes and multiple anodes.

Alternatively, as shown in FIG. 8, more than one control electrode 808 and anode 806 may be formed on a semiconductor crystal 504. The various control electrodes 808 can take any shape and size, and may be placed in various positions relative to the anode 806. As with the segments 730, 732, the different control electrodes 808 can be set at different voltages to optimize electric field distribution. In addition, the control electrodes 808 can be formed at various locations on the crystal 504 to optimize the electric field distribution.

As is also shown in FIG. 8, neither the control electrodes 808 nor the anodes 806 need be located on a surface of the detector 800 opposite to that of the cathode 804. For example, in the detector 800 of FIG. 8, the cathode 804 is formed on a first surface 810 of the cubic semiconductor crystal 802. A first control electrode 808a and the anode 806 are both formed on a second surface 840 adjacent to the first surface 810. A second set of control electrodes 808b and anodes 808b are formed on a third surface 812 opposite to the first surface 810. Alternatively, the crystal 802 could have a control electrode 808 on adjacent surface 840 and the anode 806c on another adjacent surface 842. It should be understood from the above that any distribution of the anode and control electrodes on the crystal is possible, so long as the electric field in the crystal is formed to focus the electron charge cloud toward the anode and to shield the anode from the effects of hole trapping.

Further, the cathode, anode, and control electrode need not be restricted to a single surface of the crystal. For example, as shown in FIG. 8, control electrodes 808b extend from one surface of the crystal, around the edges to adjacent surfaces. The electrodes can even extend to more than one adjacent surface. Alternatively, an electrode may be in the form of a band fully or partially encircling the crystal.

Figure 10:
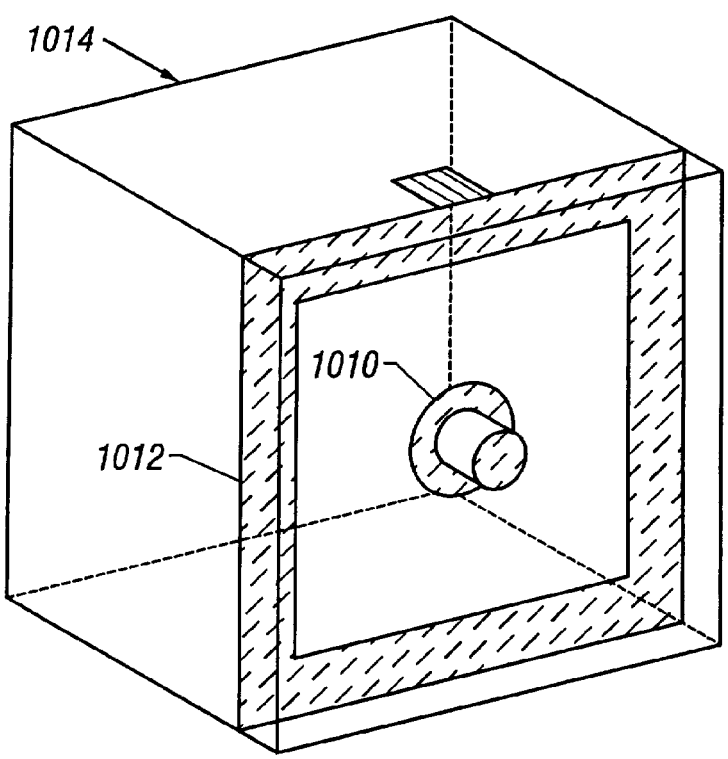
FIG. 10 is a perspective view of a radiation detector having buried electrodes.

The electrodes can be formed on or in the crystal 502 using a variety of techniques. Preferably, the electrodes are gold films, commonly used in CdZnTe detector manufacture, electrochemically deposited on the surface of the crystal 502. Alternatively, other conducting materials, including platinum, rhodium, and other metals, can be electrochemically deposited on the crystal surface 502 to form the electrodes. Those skilled in the art will recognize that nearly any conductor may be used for the electrodes. As an alternative to electrochemical deposition, the electrode material may be deposited on the crystal 502 via evaporation, sputtering, or surface alloying. The electrodes may be formed by other techniques as well, such as ion beam deposition and chemical vapor deposition of conductive materials. The electrodes may be formed in a variety of configurations, including mesa, trenched, and buried configurations. For example, FIG. 10 illustrates a buried anode 1010 and control 1012 electrode in a radiation detector 1014.

For perfect trapped charge shielding in the detector, the ratio of the anode capacitance to the total capacitance from every point inside the detector would be zero. This is approximated at most points because of the relative sizes of the anode and other electrodes and their relative distances. However, near the anode the anode capacitance becomes large because the distance to the anode is smaller than the distance to other electrodes. This effect is minimized by bringing the control electrode very close to the anode. But the difference between the control electrode voltage potential and the anode voltage potential is typically several hundred volts. That voltage potential and the dielectric strength and voltage breakdown characteristics of the materials (including air) between the two electrodes determines how close they can be located to each other. By insulating the control electrode from the crystal and from other materials with a high-dielectric-strength insulator that has good breakdown characteristics and provides a high capacitance value from the control electrode to the crystal, the distance from the anode to the control electrode can be minimized and the detector performance optimized.

Separation between the electrodes can be achieved in a variety of ways. For example, the electrodes can be separated by modifying the surface of the crystal 502, and/or by a bulk material on the surface of the crystal (i.e., by passivation or resistive layers formed by any process).

In order to provide proper electric field shaping, the control electrode should be in ohmic contact with the crystal near the perimeter of the detector. In general, all of the electrodes are preferably ohmic contacts. Nevertheless, the electrodes of the invention need not be ohmic; they could be rectifying, a p-n junction, or some other type of contact.

(F) Theory of Operation of the 3-Electrode Radiation Detector

The operational aspects of the radiation detector of the invention will be described with reference to the preferred embodiment of FIG. 5A. Nevertheless, it should be recognized that the principles described below apply to any embodiment of the invention.

Following is a discussion of what is believed to be the physical basis for the operational characteristics of 3-electrode embodiments of the invention. While sound theoretical considerations indicate that this theory of operation of the invention is correct, it should be understood that the utility of the invention does not rest on the correctness of the following discussion. Further, although the following description refers to radiation detector 500 of FIG. 5A, it should be understood that the principles and theories described are applicable to any configuration of the invention.

The semiconductor crystal 502 has electrons and holes. When an ionizing event occurs within the crystal 502, electrons and holes are formed into electron and hole charge clouds that are transported in a particular manner within the crystal 502. As explained above, the essential electron and hole parameters describing transport properties are (1) mobility, $\mu$, which determines how fast an electron or hole travels in a particular electric field, and (2) trapping lifetime, $\tau$, which is the average time an electron or hole generated by an ionizing radiation remains free and able to participate in the transport process. The mobility-lifetime product ($\mu\tau$) is a critical parameter to consider in analyzing semiconductor radiation detectors, and there is a mobility-lifetime product for electrons, $(\mu\tau)_e$, and a mobility-lifetime product for holes, $(\mu\tau)_h$. The mobility-lifetime product generally differs significantly for electrons and holes in a particular semiconductor. If electrodes are formed on the semiconductor and a voltage potential established between the electrodes, an electric field, E, in the semiconductor will cause the electrons to drift to the anode and the holes to the cathode.

In semiconductors such as CdTe and CdZnTe, the mobility-lifetime product for electrons is generally much larger than that for holes, with the mobility-lifetime ratio, $(\mu\tau)_e/(\mu\tau)_h$, typically being greater than 10. (The principles described below, however, also apply to semiconductor detectors for which $(\mu\tau)_h/(\mu\tau)_e$ is smaller or larger.) The mobility-lifetime ratio may be even higher in other high resistivity semiconductors, such as $HgI_2$ and PbI. For conceptual purposes, assume that the mean-free drift length ($\mu\tau E$) is large for electrons and small for holes with respect to the detector thickness. Essentially all electrons generated by ionizing radiation reach the anode, and many of the holes are trapped before reaching the cathode. Under these conditions, the amount of charge transported in a planar detector will depend strongly on the position within the crystal at which the ionizing event occurs. If the event occurs very near the cathode, electrons will be swept all the way across the crystal to the anode, holes will be swept to the cathode, and the full charge deposited by the ionizing radiation will be sensed in the external circuit. If the event occurs near the anode, the electrons will be swept to the anode, but holes will be trapped, and the net effect will produce a much reduced output signal. In between, the fraction of deposited charge induced in the external circuit is a function of the distance from the anode at which the event occurs. The dependence of charge response on the position at which the event occurs is the source of unwanted low-energy tailing in planar detectors.

With the three-electrode detector of the invention, at least two factors contribute to the elimination of low-energy tailing.

First, low-energy tailing is reduced by approximately the ratio of the anode area to the control-electrode and cathode areas. When a charge cloud is generated by an ionizing event in the detector 500, charge is induced on all electrodes. The electric field 518 established by the voltages on the electrodes guides the electron cloud to the anode 506 and the hole cloud to the cathode 504. The charge induced on the control electrode 508 is, in general, initially much larger than the charge on the anode 506 because of the relative capacitances between the charge clouds and the anode 506 and the control electrode 508 (approximately the ratio of their areas). This condition is true except when a charge cloud is closer to the anode 506 than to the control electrode 508. As an electron cloud arrives at the anode 506, it accelerates as it gets very near the anode 506 because of the high concentration of electric field 518 at the anode 506, and the charge on the anode 506 builds up very rapidly to the full value of the electron cloud. Conversely, as hole clouds move to the cathode 504, their effect on the anode 506 diminishes. Thus the effects that produce low-energy tailing in planar detectors are reduced from the anode signal by an amount that is approximately the ratio of the anode area to the control-electrode and cathode areas. Thus, the signal charge, which is the total charge collected by the anode 506, is essentially the full charge of the ionizing event, regardless of the position at which the event occurred within the crystal 502. It can be seen that this method of detection removes from the anode charge response its dependence on the position of the ionizing event, which is the source of unwanted low-energy tailing. Furthermore, the negative bias on the control electrode 508 inhibits the collection of electron charge clouds by the control electrode 508, thus maintaining high collection efficiency.

Figure 5B:
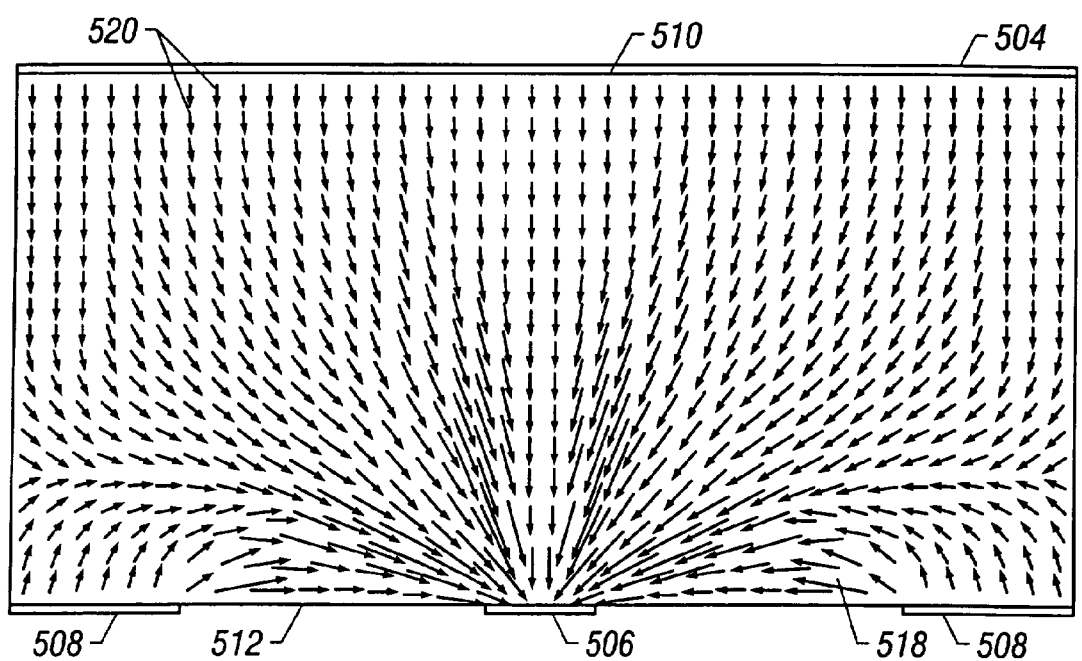
FIG. 5B is a cut-away side view of the embodiment illustrated in FIG. 5A taken along line 5B—5B, showing the electrical force field created in the semiconductor crystal.

Second, electric field shaping helps reduce low-energy tailing. FIG. 5B is a cut-away side view of the radiation detector 500 of FIG. 5A, showing a calculated electric field 518 that is believed to be created by the preferred three-electrode configuration. As can be seen in FIG. 5B, the electric field 518 is characterized by field paths 520 within the crystal 502 that are uniformly parallel for most of the distance between cathode 504 and anode 506. The field paths become highly concentrated as they closely approach the anode 506. Because the fraction of charge induced on the anode 506 is a function of the position of the charge clouds at any instant in time, and because the electric field 518 concentration causes the drift velocity to increase as the clouds approach the anode 506, a large fraction of the total charge is induced on the anode 506 within a short time. Enhancement of field concentration at the anode 506 by the control electrode 508 results in a charge signal at the anode 506 that has a faster rise time and minimizes the variance in rise times that are normally encountered in semiconductors such as CdTe and CdZnTe. This in turn results in more uniform amplification by external circuits 516 that have finite clipping times.

(G) Example of Operation

Figure 9:
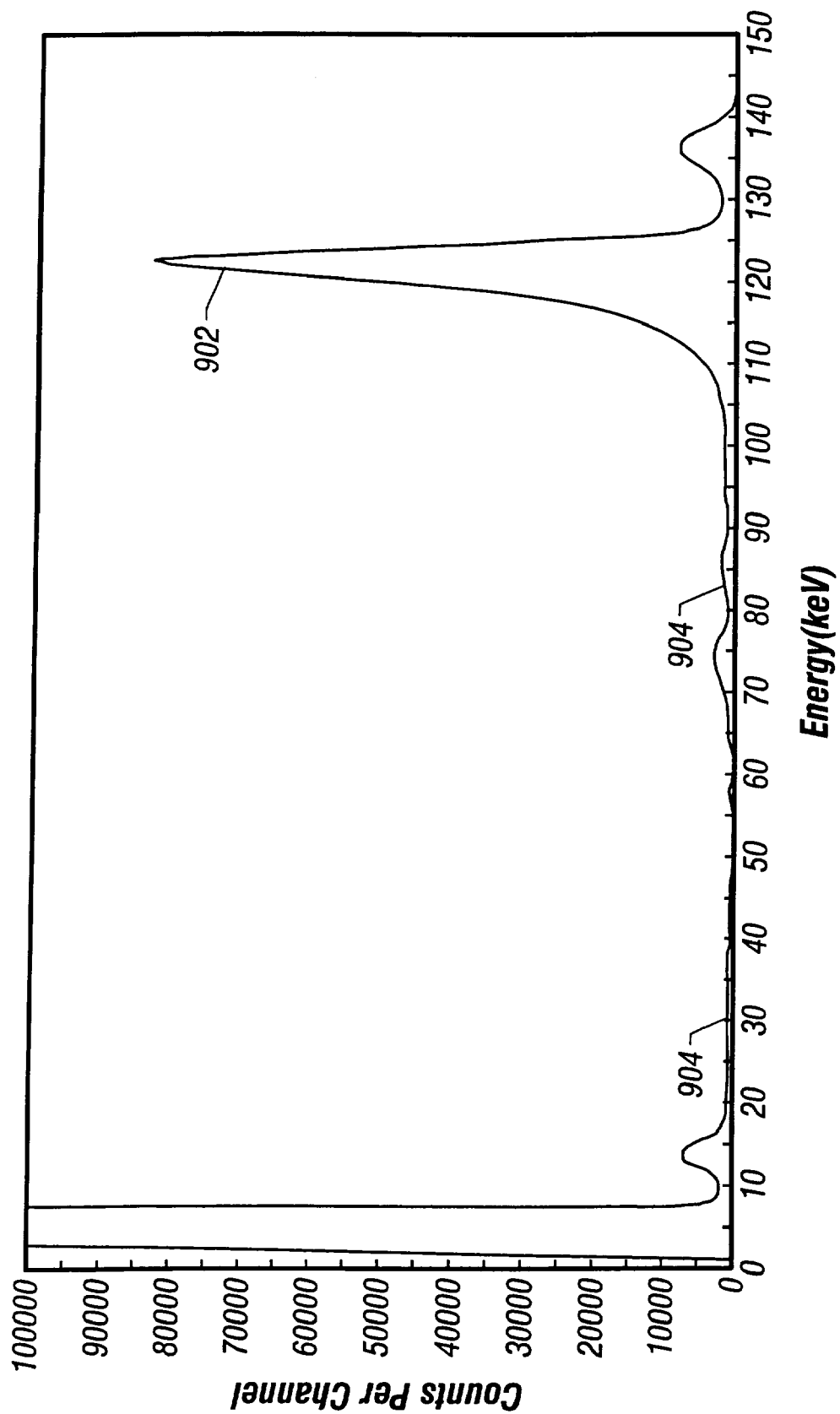
FIG. 9 is an energy pulse histogram for the detector element illustrated in FIG. 5A, employing a CdZnTe semiconductor.

FIG. 9 shows a signal pulse histogram of the gamma radiation from Tc-99mm for an actual radiation detector configured in accordance with the 3-electrode detector 500 of FIG. 5A. The actual detector employed a rectangular parallelepiped CdZnTe semiconductor crystal. The dimensions of the crystal were about 6.1 mm by 6.1 mm on the sides, with a thickness of about 3 mm. The detector had a cathode covering one surface of the crystal and an anode and control electrode on the opposite surface, with $V_a$=0 volts, $V_b$=−450 volts, and $V_c$=−250 volts.

Figure 1:
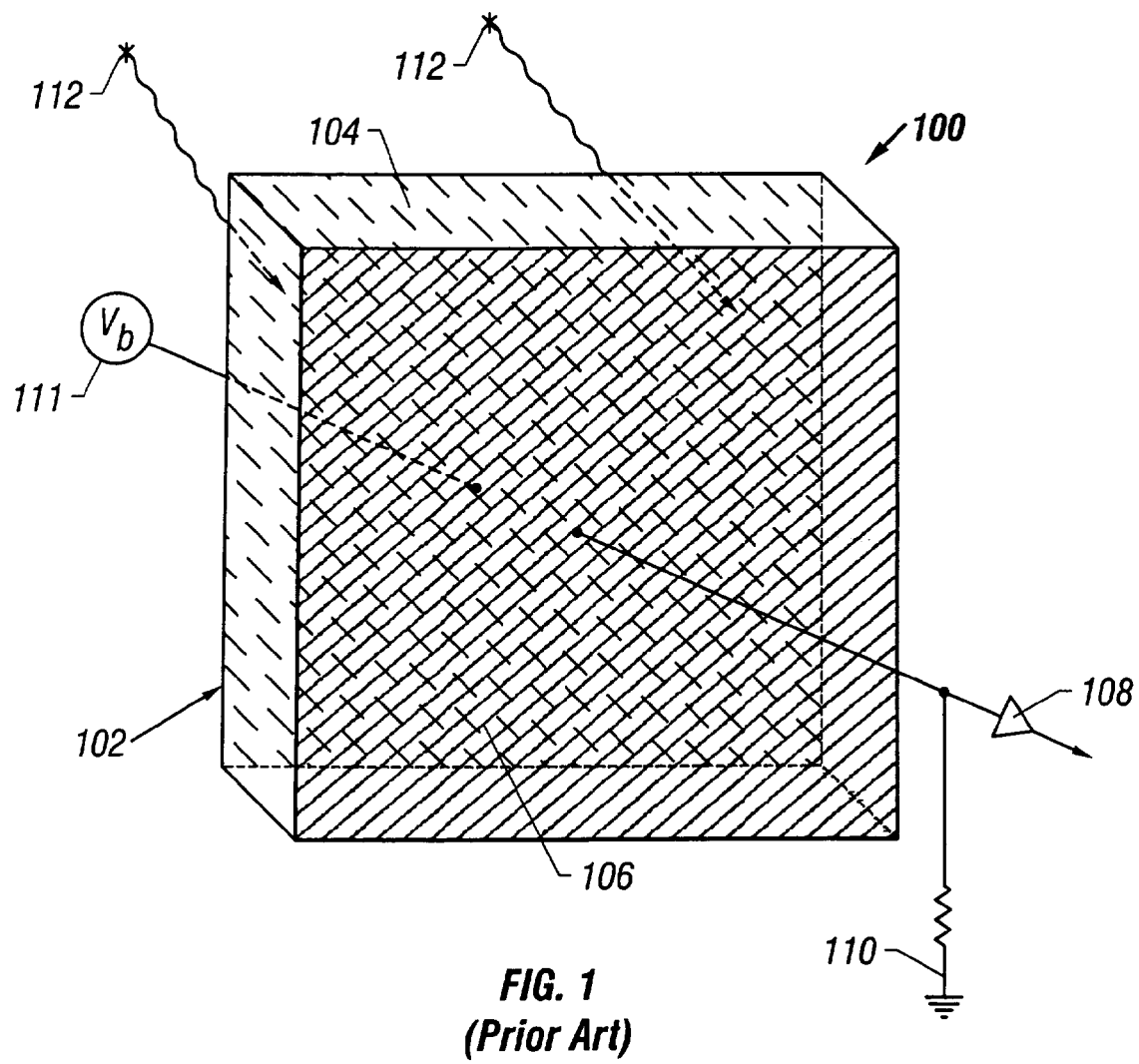
FIG. 1 is a perspective view of a prior art planar radiation detector.
Figure 2:
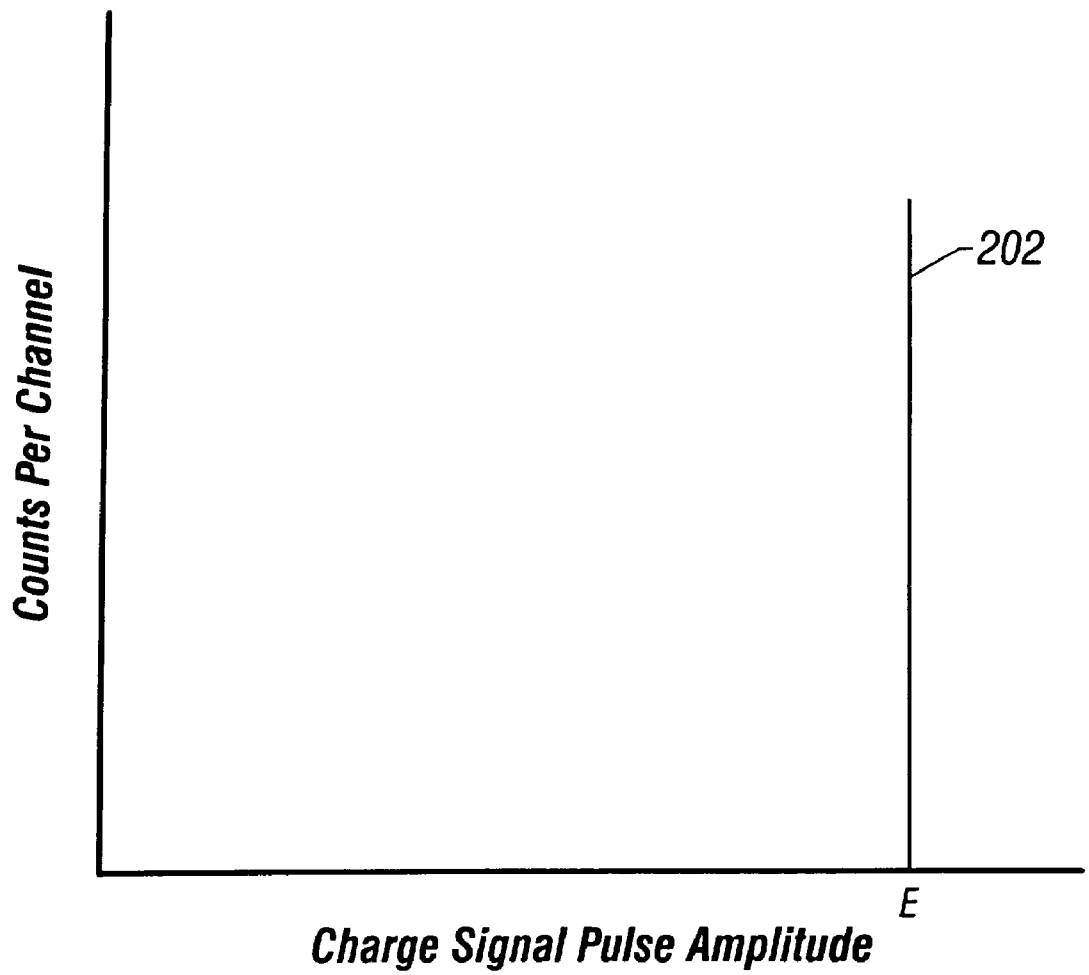
FIG. 2 is an energy pulse histogram for an ideal radiation detector in which counts per channel are plotted versus charge signal pulse amplitude.
Figure 3:
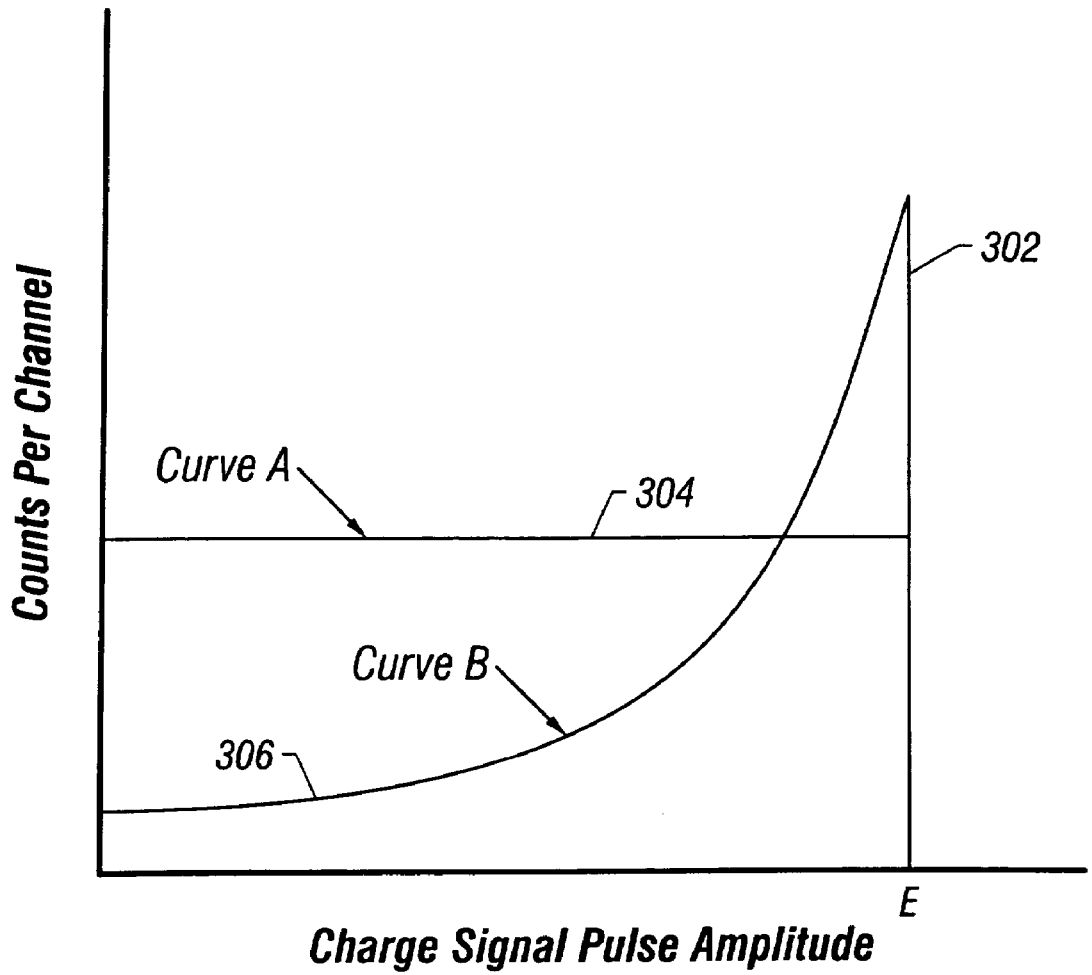
FIG. 3 is an idealized energy pulse histogram for two different radiation detectors, in which Curve A represents the histogram that results if the ionizing radiation are absorbed uniformly throughout the semiconductor crystal, and Curve B represents the histogram that results if absorption is large near the cathode and drops off exponentially as the ionizing event moves in a direction away from the cathode.
Figure 4:
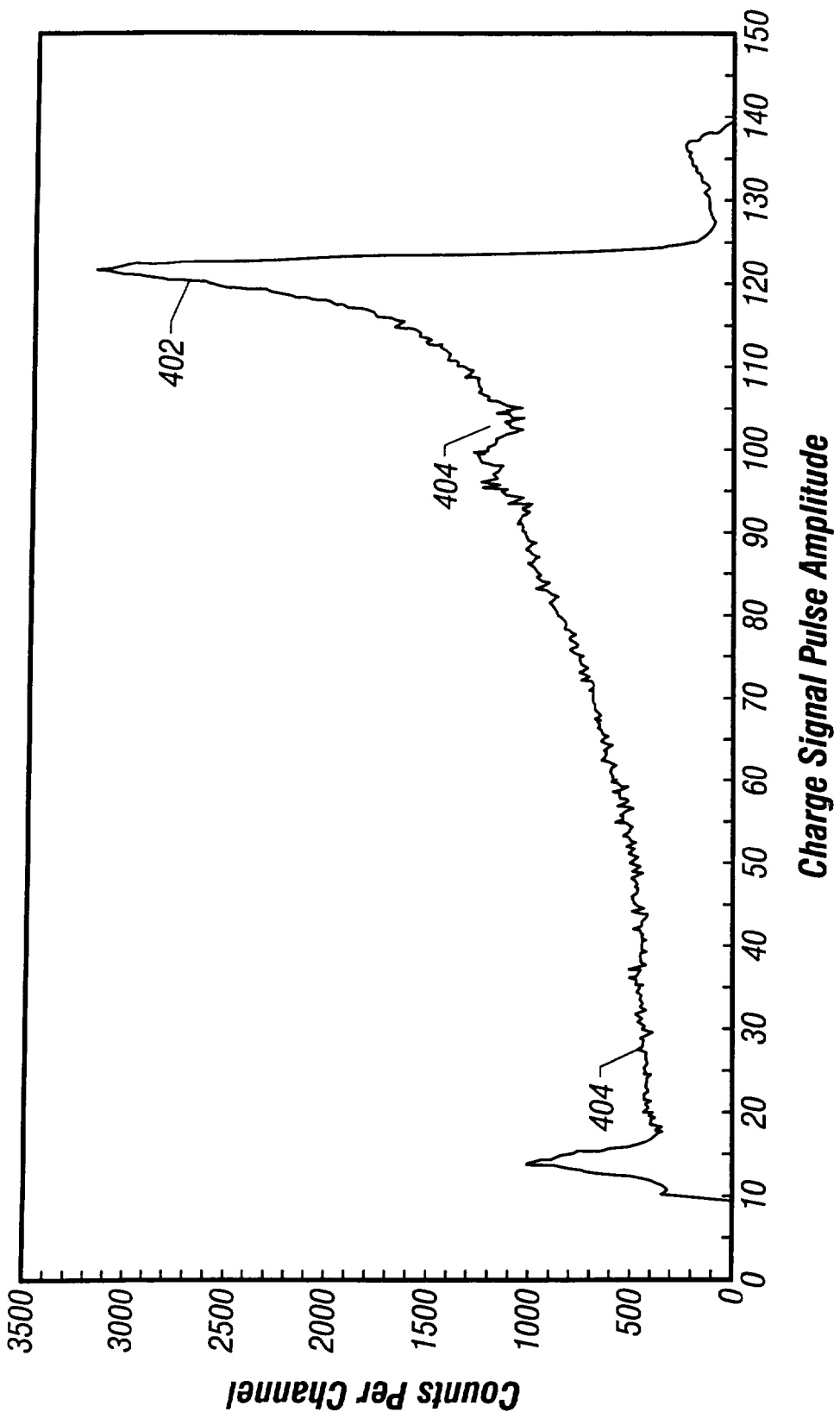
FIG. 4 is an energy pulse histogram for an actual prior-art CdZnTe planar detector, illustrating low-energy tailing.

FIG. 9 clearly demonstrates the virtual elimination of low-energy tailing that can be achieved with the invention. A large photopeak 902 exists at the energy level of the ionizing radiation, and only a small amount of low-energy pulses were detected, indicated by tail 904. The reduction in tailing achieved with the detector of the invention is evident in comparing the histogram FIG. 9 with that of FIG. 4. The histogram of FIG. 4 was acquired with a conventional CdZnTe planar detector with the same crystal dimensions and quality as that of FIG. 9. As can be seen, FIG. 4 has a broadened photopeak 402 at the target energy, indicating a degradation of resolution, and a substantial amount of low-energy tailing 404, indicating a reduction in peak efficiency. It is interesting to note the relative amplitudes of the three energy peaks. The total counts in the peaks should be proportional to the emission probabilities for those peaks. For cobalt-57, those probabilities are: 1) 14.413 KeV—9.14%, 2) 122.06 KeV—85.68%, and 3) 136.45 KeV—10.67%. In FIG. 9, the relative magnitudes of counts in the peak are very close to those emission probabilities, while, in FIG. 4, it appears that at least half of the counts that should be in the peaks are in the low-energy tails of the higher energy peaks. (The two curves of FIGS. 4 and 9 were obtained with detectors of identical dimensions and identical surrounding materials; therefore, the two curves can be compared for relative peak amplitudes, although direct comparison of peak amplitudes cannot be made without photon absorption data for each peak.)

Accordingly, as evidenced by the histogram of FIG. 9, the addition of the control electrode 508 and its affect on the shape of the electric field 518 results in virtual elimination of low-energy tailing. The detector of the invention therefore achieves high-resolution and collection efficiency, despite the charge transport problems inherent in high-resistivity, large-mobility-lifetime-ratio semiconductor materials. Furthermore, the invention is simple and inexpensive to manufacture.

(H) Additional Aspects and Features of Operation

The magnitude of $V_c$ can be established by experiment. If the magnitude of $V_c$ is too small, the anode 506 will collect only some of the electron clouds, and the collection efficiency of the radiation detector 500 will be low. The optimum value for $V_c$ is dependent on electrode geometry. In the radiation detector 500 of FIG. 5A, the preferred value of $V_c$ is in the range from $(V_a+V_b)/2$ to $V_b$. The value of $V_b-V_a$ is chosen based on the thickness of the semiconductor crystal and the requirement of the application. For a 3 mm thick crystal, $V_b-V_a$ may be about −400 volts.

The resistances between the cathode 504 and control electrode 508 and between the control electrode 508 and anode 506 can be tailored to achieve specific performance results. This is done by varying the electrode geometry and by changing bulk or surface resistivity by ion damage, ion implantation, thermo-chemical treatment, and/or other means.

The radiation detector of the invention can be used with nearly any crystal thickness. Preferably, however, the thickness is at least about 0.5 mm. The only limitation on the thickness is that the larger $\mu\tau$ product, i.e., $(\mu\tau)_e$ or $(\mu\tau)_h$, must be sufficiently large for most of the charge carriers to traverse the thickness of the crystal. For a single anode on a crystal, the useful area of the detector may be limited by the ability to form an electric field that will guide the electron clouds to the anode without excessive charge trapping. Large areas may be achieved by appropriate geometries for the anode and the control electrode. Larger areas may also be used by forming grid structures similar to the detector array configuration described below, but with the anodes connected together.

Thus, the thickness of the semiconductor crystal of the invention can be substantial and, thereby, can provide high sensitivity and high detection efficiency for a wide range of radiation energies.

If an embodiment of the new device is maintained in a constant flux of ionizing radiation, varying the voltage ($V_c$) of the control electrode 508 can cause the count rate to vary in a corresponding manner. Thus, the radiation detector of the invention can be used to modulate the signal from a beam of ionizing radiation.

(2) 4-Electrode Radiation Detector

An alternative embodiment provides an improved structure for achieving enhanced charge collection in the photopeak of a solid-state radiation detector that exhibits charge carrier trapping, particularly holes. This embodiment is particularly advantageous with large volume radiation detectors used for achieving high-efficiency detection and for high-energy gamma-rays. As the volume of a radiation detector increases, it is more difficult to simultaneously achieve good energy resolution, good detection efficiency, and good peak-to-valley efficiency in the spectrum. The purpose of this embodiment of the invention is to minimize the compromise among these parameters.

The 3-electrode radiation detector described above uses a control electrode positioned around the anode to focus the charge from the total detector volume to the anode and to shield from the anode the effects of induced positive charge of trapped holes. However, the ideal electrical potential of the control electrode for focusing electron charge to the anode may be approximately the potential of the cathode, while optimum shielding is achieved when the control electrode covers the entire surface not covered by the anode. In the latter case, there must be sufficient distance between the anode and the control electrode to avoid voltage breakdown at the anode. These requirements seem to be mutually exclusive, each requiring some compromise for achieving overall acceptable performance.

Figure 11A:
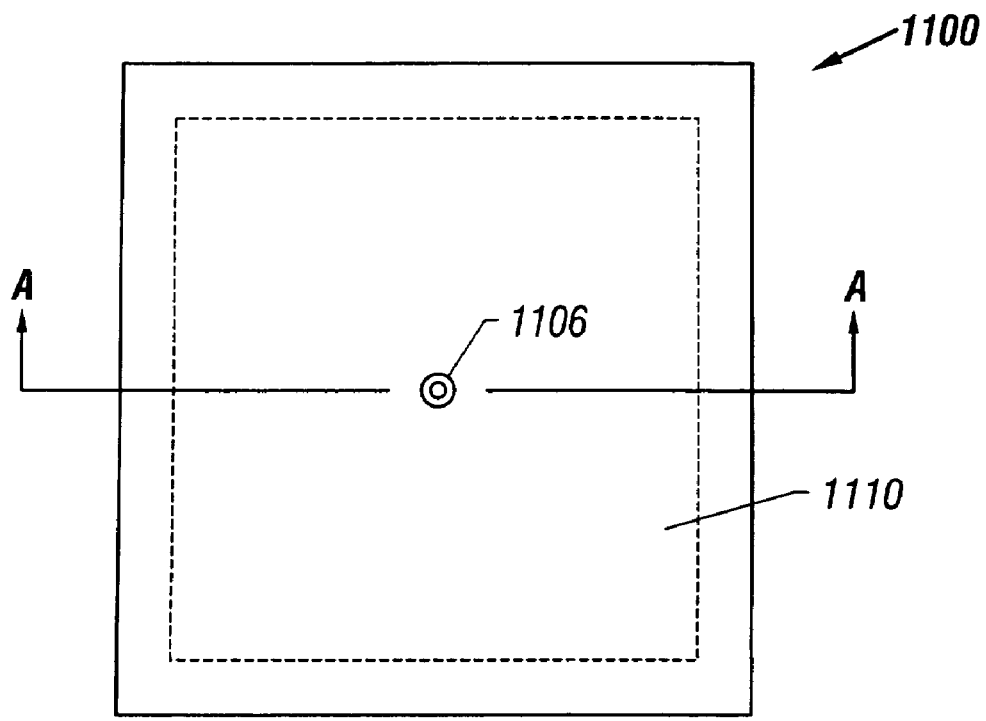
FIG. 11A is a top view of a 4-electrode detector.
Figure 11B:
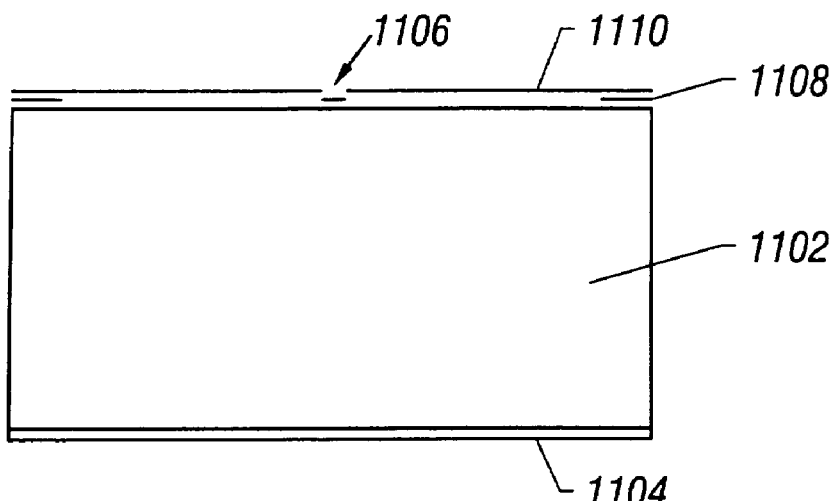
FIG. 11B is a side cross-sectional view of the 4-electrode configuration of FIG. 11A, taken along line A—A.

An alternative embodiment of the invention separates the charge focusing function and anode shielding functions of the control electrode by having a shield electrode separate from a focus control electrode—in essence adding a fourth electrode to the three-electrode configuration described above. FIG. 11A is a top view of the preferred embodiment of a 4-electrode configuration of the invention. FIG. 11B is a side cross-sectional view the 4-electrode configuration of FIG. 11A, taken along line A—A of FIG. 11A. In this embodiment, the radiation detector 1100 includes a semiconductor crystal 1102, a bias electrode (e.g., a cathode) 1104, a signal electrode (e.g., an anode) 1106, a focus control electrode 1108, and a shield electrode 1110 shown insulated from and overlying the focus control electrode 1108.

In a typical configuration, the bias electrode 1104 is a cathode that provides the negative electrical potential for biasing the radiation detector 1100, the signal electrode 1106 is an anode that collects the signal charge, the focus control electrode 1108 focuses the electron charge to the anode, and the shield electrode 1110 minimizes charge at the anode induced by trapped charges within the radiation detector 1100. In most applications where this embodiment is applicable, the charge transport properties are better for electrons than for holes. In any application where the reverse is true, the same structure can be applied with the bias voltage reversed. Thus, the signal electrode 1106 would become the cathode and the bias electrode 1104 would become the anode. The other electrodes would be the same as described with appropriate bias voltages applied.

The focus control electrode 1108 can be strategically placed on the surface of the radiation detector 1100 for best shaping of the electrical field without the need for high capacitance, and thus can maintain adequate distance from the anode to avoid injection of pulse-breakdown noise into the anode signal. In the illustrated embodiment, the focus control electrode 1106 is formed as a narrow band around the perimeter of the signal electrode 1106 side of the radiation detector 1100.

The shield electrode 1110 preferably covers most of the anode-side of the radiation detector 1100, except for an area large enough for the anode. The shield electrode 1110 can be held at any convenient electrical potential. In the preferred embodiment, the shield electrode 1110 is directly or capacitively connected to ground (perhaps via the cathode) in order to provide good shielding characteristics, and is isolated from the anode to prevent charge injection into the signal. In addition, the shield electrode 1110 should be insulated from the detector surface to prevent from collecting electron charge.

The shield electrode 1110 should have a high capacitance with respect to points within the radiation detector 1100. Thus, in the preferred embodiment, the shield electrode 1110 is insulated from the surface of the radiation detector 1100 by a material that has a high dielectric constant for maximum capacitance to points within the detector, and high dielectric strength to avoid voltage breakdown. One such material is epoxy-based solder mask.

In this embodiment, performance of the radiation detector 1100 relies primarily on the focus control electrode 1108 for achieving maximum detection efficiency and on the shield electrode 1110 for eliminating the effects of charge trapping (typically hole trapping). By assigning the charge-shielding function to the shield electrode 1110 and making the function of the focus control electrode 1108 principally that of shaping electrical field within the radiation detector 1100, both functions can be performed better. Use of a shield electrode 1110 may also be applicable to any device where it is beneficial to shield an electrode from the effects of induced charge from trapped charge carriers.

(3) 5-Electrode Radiation Detector

Figure 11C:
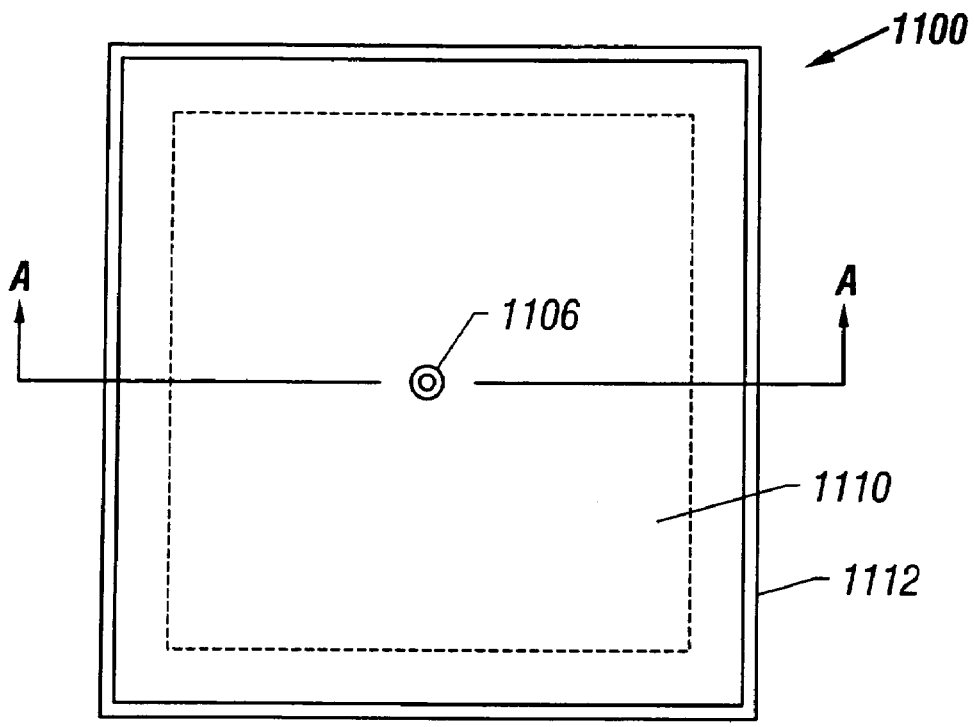
FIG. 11C is a top view of a 5-electrode detector.
Figure 11D:
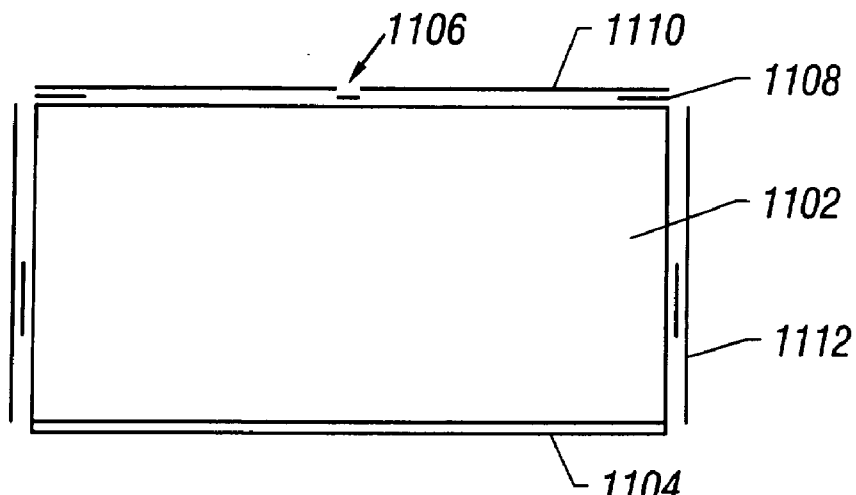
FIG. 11D is a side cross-sectional view of the 5-electrode configuration of FIG. 11C, taken along line A—A of FIG. 11C.

Another embodiment of the invention adds a supplement shielding fifth electrode 1112 to the radiation detector 1100 shown in FIG. 11B. FIG. 11C is a top view of the preferred embodiment of a 5-electrode configuration of the invention. FIG. 11D is a side cross-sectional view the 5-electrode configuration of FIG. 11C, taken along line A—A of FIG. 11C. A typical configuration of such a radiation detector 1100 is a parallelopiped or a right circular cylinder with a fifth electrode 1112 covering most or all of the side surfaces orthogonal to the anode and cathode surfaces. The fifth electrode 1112 may be plated on the side surfaces or insulated from those surfaces. If the fifth electrode 1112 is ohmically connected to the side surfaces, a bias voltage is applied that helps in shaping the electric field in the radiation detector 1100 for optimum charge collection at the anode. If the fifth electrode 1112 is not ohmically connected to the detector, it must be connected, at least capacitively, to reference ground (which could be through some power supply or by direct connection). The fifth electrode 1112 may be patterned into different shapes if desired.

The fifth electrode 1112 increases the capacitance in the denominator of the capacitance ratio that determines charge induced on the anode. In other words, the fifth electrode 1112 serves to increase the shielding of induced charge from the anode, and may also be used to shape the electric field in the detector. The function of shaping electric field may be important in some geometries.

In similar fashion, additional electrodes can be added, each with its own voltage for shaping electric field and, thereby, optimizing charge collection, in addition to providing additional charge shielding.

(4) Timing Correction for Electron Trapping

When a gamma ray is absorbed in a radiation detector made in accordance with the invention, electrons and holes are formed at the site of the event and, as they drift toward the collecting electrode(s), a signal is induced on the electrode(s). With the electrode configurations described above (see, for example, FIGS. 5A and 11A), the signal generally is initially induced on the cathode and on the control electrode but does not show up on the anode until the electrons have drifted close to the anode.

By measuring the signals on the cathode, control electrode, and anode, a timing relationship can be determined for the occurrence of the initiating event and for the arrival of the drifting electrons at the anode. For example, the time from when the cathode signal exceeds a selected threshold, $T_c$, to the time when the anode signal exceeds a selected threshold, $T_a$, can be measured using any of many conventional means. As another example, the time from when the signal on the control electrode exceeds a selected threshold, $T_{cr}$, to the time when the anode signal exceeds a selected threshold, $T_a$, can be measured using any of many conventional means. Such timing information is important for a number of reasons.

(1) Knowing the time of absorption is important for positron emission tomography (PET) for determining coincidence with a similar event in another detector. Coincident timing on the order of 10 nsec may be required for many PET applications.

(2) Knowing the drift time of the electrons can allow signal compensation for the effects of electron trapping in large detectors. In prior art detectors, the effects of hole trapping predominate and the effects of electron trapping are small. The effects of hole trapping are so severe that no meaningful improvement can be achieved by compensation for electron trapping. However, in a radiation detector made in accordance with the invention in which the effects of hole trapping have been nearly eliminated, electron trapping becomes a more prominent factor. Also, electron trapping may be somewhat greater in such radiation detectors because the electric field is non-uniform and is intensified near the small anode and correspondingly decreased away from the anode. Where the electric field is low, the transit time should be longer, with a corresponding increase in charge trapping. In a planar detector, the electric field is expected to be uniform. In a 3 mm cubic planar radiation detector, typical electron trapping varies from 0% to about 3% depending on the location of gamma-ray absorption and the corresponding drift-path length. As the detector size gets larger and path lengths get longer or electron mean-free drift lengths get shorter, energy resolution is more affected by electron trapping.

By determining the drift time of electrons in the detector, an improvement in energy resolution can be realized by correcting for electron trapping. This can be done by measuring the electron drift time and adding to the signal a small amount of charge that is a function of the drift time. The amount of charge added for the maximum drift time would be set equal to the maximum electron-charge loss corresponding to that maximum drift time. Though the charge loss is a negative exponential function of the drift time, for systems in which the maximum charge loss is a few percent, the charge loss can be closely approximated with linear proportionality. The equation for electron charge trapping is:

$$q_{e(\text{trapped})} = q_0\left(1 - e^{-\frac{t}{\tau_e}}\right) = q_0\left[1 - \left(1 - \frac{t}{\tau_e} + \frac{t^2}{2\tau_e^2} - \frac{t^3}{6\tau_e^3} + \ldots\right)\right]$$

$$q_{o(\text{trapped})} \approx \frac{t}{\tau_e} \quad \text{for } t \text{ much smaller than } \tau_e.$$

The system would be calibrated using conventional techniques to obtain the best energy resolution. Adding lost charge to delayed events will narrow the energy peak; however, adding more charge than was lost will again widen the energy peak.

Another method for compensating for electron charge loss is by measuring the charge induced on the cathode and control electrode(s) by trapped hole charge and trapped electron charge, and using the measured magnitudes to determine the amount of compensation to provide.

(3) The depth of interaction of an ionizing event in the semiconductor crystal can be determined from timing information. For example, for the embodiment shown in FIGS. 10A and 10B, an ionizing event occurring closer to the cathode than the anode will cause the time from when the cathode signal exceeds a selected threshold, $T_c$, to the time when the anode signal exceeds a selected threshold, $T_a$, to be different than if the ionizing event occurs closer to the anode than the cathode. Calibration using conventional techniques can map the timing information to depth of interaction.

Depth of interaction is very important in any imaging application where the angle of incidence of a photon with the detection plane of the imager is other than normal to the surface and the detector thickness is comparable to or greater than the detection element size. In such cases, the photon may be absorbed deep in the detector in a detection element other than the element where the photon entered the imager surface. Applications where measurement of depth of interaction is important include coded-mask imagers and positron-emission tomography.

Another method of determining depth of interaction involves measuring the magnitude of signals on the cathode, control electrode, and/or shield electrodes. It is known that the amplitude of a detected gamma-ray-absorption event in a prior art room-temperature, semiconductor detector is dependent on the depth of interaction in the detector, i.e., the correct magnitude is decreased by a factor that is a function of the depth at which holes are trapped, which in turn is a function of the location at which the initiating photon is absorbed. In the present invention, the full amplitude signal is obtained at the anode because the anode is shielded from the effects of trapped charge by the other electrodes, while the signals on the other electrodes are each a function of the position of the trapped charge. For any given detector geometry and material, a relationship between the relative magnitude of an electrode signal and the depth of photon absorption can be established by analysis or by testing. In a planar detector, the charge induced on the cathode by trapped charge is a linear function of the distance of the trapped charge between the anode and cathode, and the mean location of the trapped charge is a fixed distance from the depth of photon absorption, i.e., it is established by the mean-free drift length ($\mu\tau E$). In the present invention, if the electrodes on the anode side of the detector cover essentially the entire anode side of the detector, the relationship between the magnitude of the cathode signal and depth of photon interaction is essentially identical to that of a planar detector. The depth of interaction can be determined by dividing the cathode signal by the anode signal and multiplying the product by the appropriate function. Likewise, a relationship can be determined between depth of interaction and the magnitudes of each of the other electrodes.

Determination of depth of interaction in some detector designs may require combining signals from more than one electrode in order to take into account geometric considerations. For some applications, although the use of all signals might be required for best accuracy, sufficient accuracy may be achieved with the signal from only a single electrode.

(5) Cross-Strip Radiation Detectors

The above-described radiation detector designs with shielding and focusing electrodes may be used to form various cross-strip detectors.

Figure 12A:
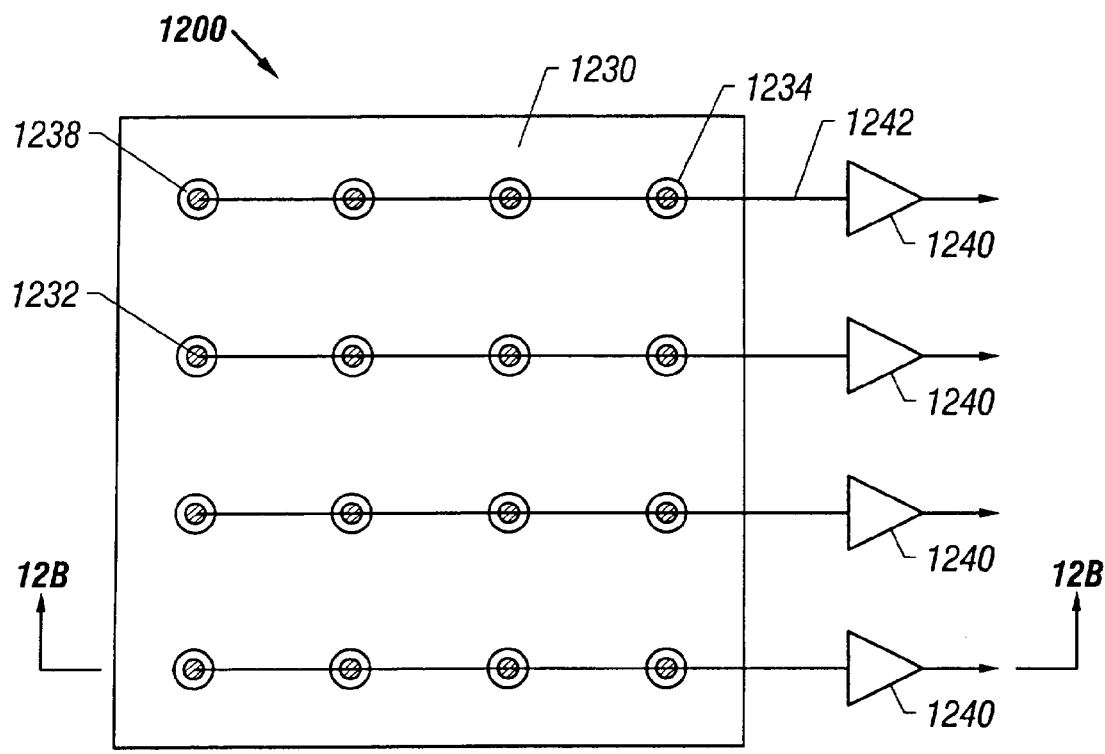
FIG. 12A is a top view of a first embodiment of the invention with an anode pattern as an anode-cathode cross-strip detector.
Figure 12B:
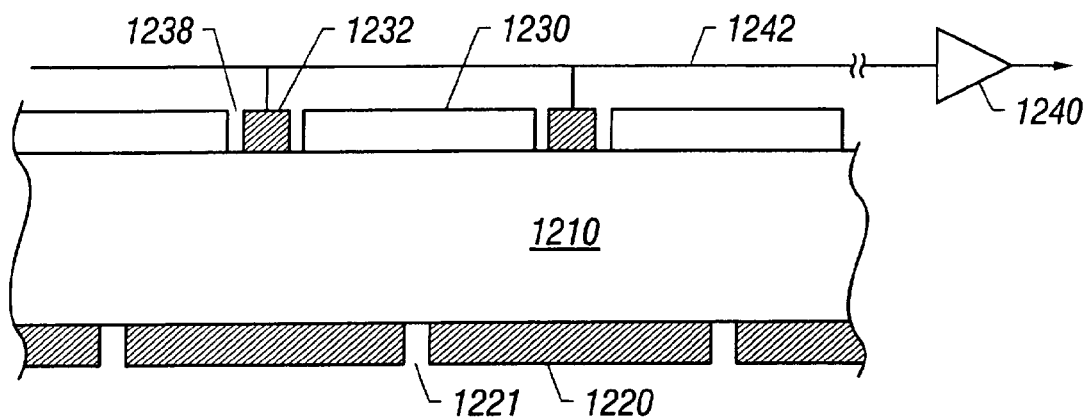
FIGS. 12B and 12C are respectively a side view taken along line 12B—12B and a bottom view of the embodiment shown in FIG. 12A.
Figure 12C:
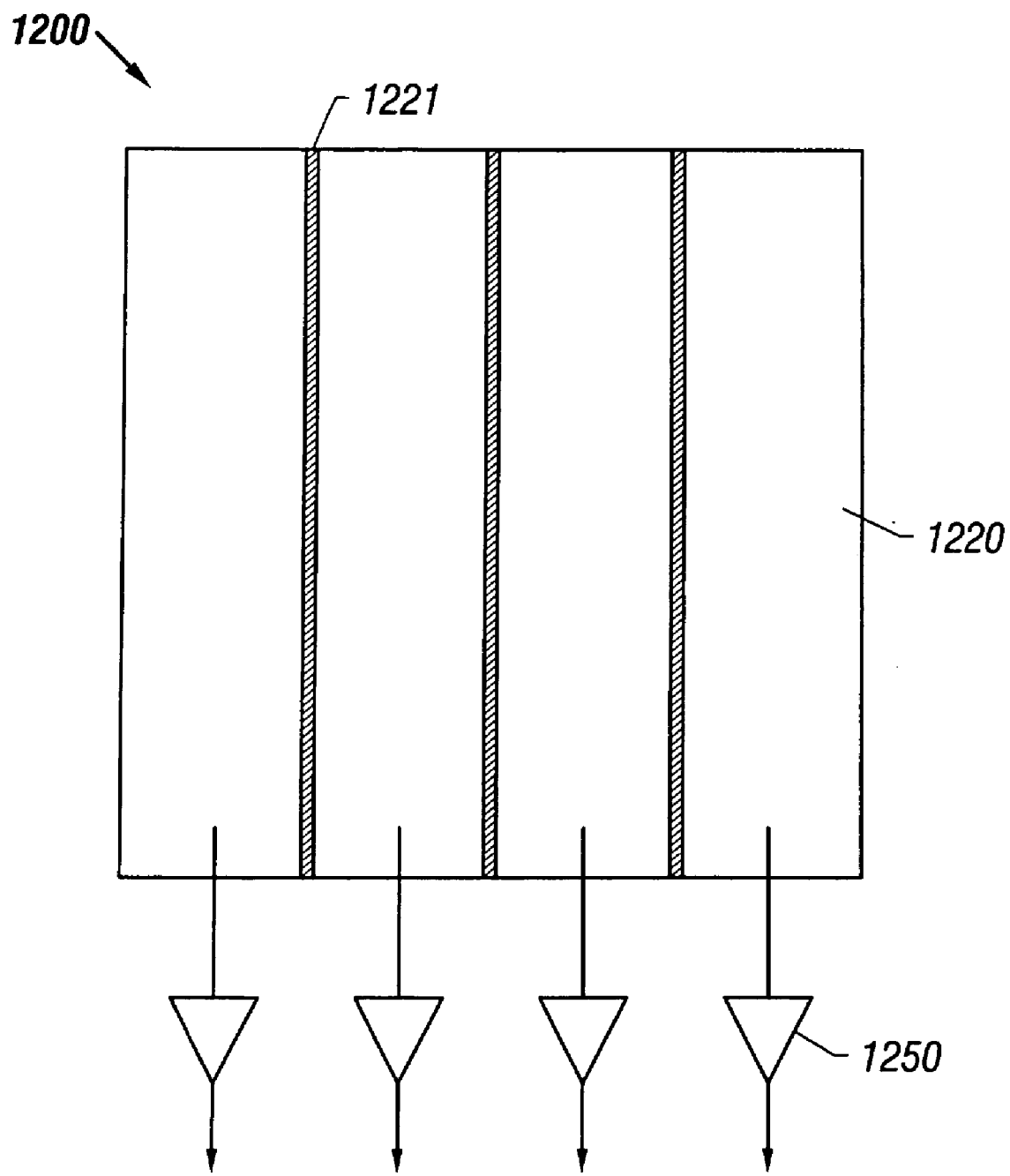

FIGS. 12A, 12B, and 12C show one embodiment of a cross-strip detector 1200 in accordance with the invention. FIG. 12A is a top view, FIG. 12B is a side view taken along line 12B—12B, and FIG. 12C is a bottom view. An array of anodes 1232 is formed on a semiconductor crystal 1210 by "dot"-like anodes as described in FIG. 5A. The anodes 1232 within a row are connected in series to form an anode row 1242. A control electrode 1230 common to all anodes is formed on one surface of the semiconductor crystal 1210 with openings 1234 surrounding the anodes 1232. The control electrode 1230 and the anodes 1232 are separated by a gap 1238 which provides electrical insulation. The cathode formed on the opposite surface of the semiconductor crystal 1210 is a plurality of parallel cathode stripes 1220 along the column direction that is orthogonal to the rows 1242 formed by the anodes 1232. Two adjacent cathode stripes 1220 are electrically separated by an insulating gap 1221. Preferably, each of the cathode strips 1220 is as wide as possible and the insulating gaps 1221 are kept to a minimum width which is sufficient to maintain electrical insulation between adjacent cathode stripes 1220.

Each anode row 1242 and cathode column 1220 are coupled to amplification circuitry 1240 or 1250 and signal processing circuitry (not shown). When a photon (or a particle) is absorbed in the crystal, a signal appears on an anode 1232 and on a cathode strip 1220 near a location where the photon hits. The location is determined by the intersection that produces simultaneous signals. Thus, each anode 1232 defines a sensing detection element and the entire array is capable of producing a two-dimensional image indicative of the pattern of the radiation absorption.

Alternatively, the output signals from anodes 1232 may be combined together so that the array is effectively a large "single-cell" detector. Such a detector eliminates or significantly reduces effects of trapped charge from the signal and low-energy tailing. In addition, good energy resolution of each detection element is preserved.

The benefits of the cross-strip detector in FIGS. 12A, 12B, and 12C include a reduction in the number of channels of electronics and finer spatial resolution. In addition, spatial resolution on one side of the detector may be better than the other side with the same electrode-strip spacing. For example, while electrons are, in general, collected totally on one strip, trapped charge induces signal on all strips. The two or three strips nearest the trapped charge may have sufficient induced charge to be useable signals. The relative magnitudes of such signals would provide finer spatial resolution than the pitch of the strips.

Figure 13:
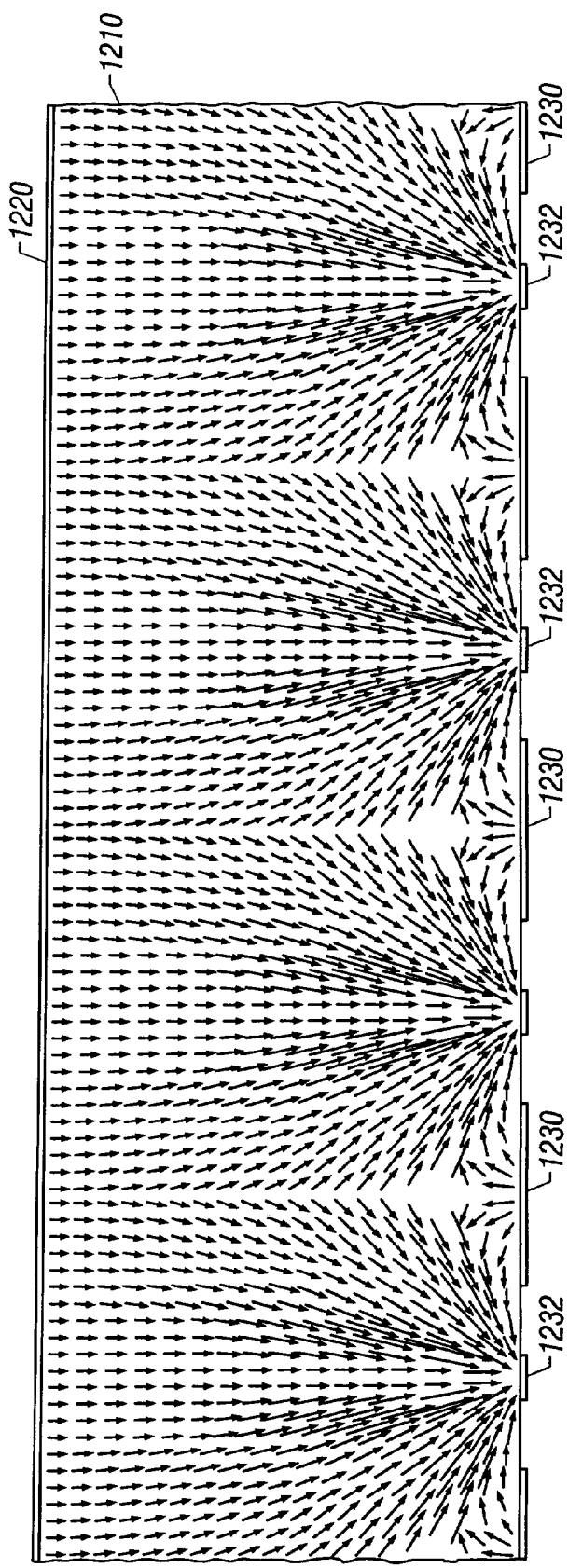
FIG. 13 is a cut-away side view of the array embodiment shown in FIGS. 12A–12C.

As described previously, the control electrode 1230 may also be used to provide shielding and focusing mechanisms. The potential $V_c$ of the control electrode 1230 may be adjusted at a potential level lower than that of the anodes 1232 to better separate neighboring anodes 1232 in signal detection. FIG. 13 shows such a field experienced by an electron in the cross-strip detector 1200 that is configured to provide isolation between adjacent detection elements. The effect of the cathode discontinuity caused by the narrow insulating gaps 1221 on the electric field within the crystal 1210 is negligible.

Figure 14A:
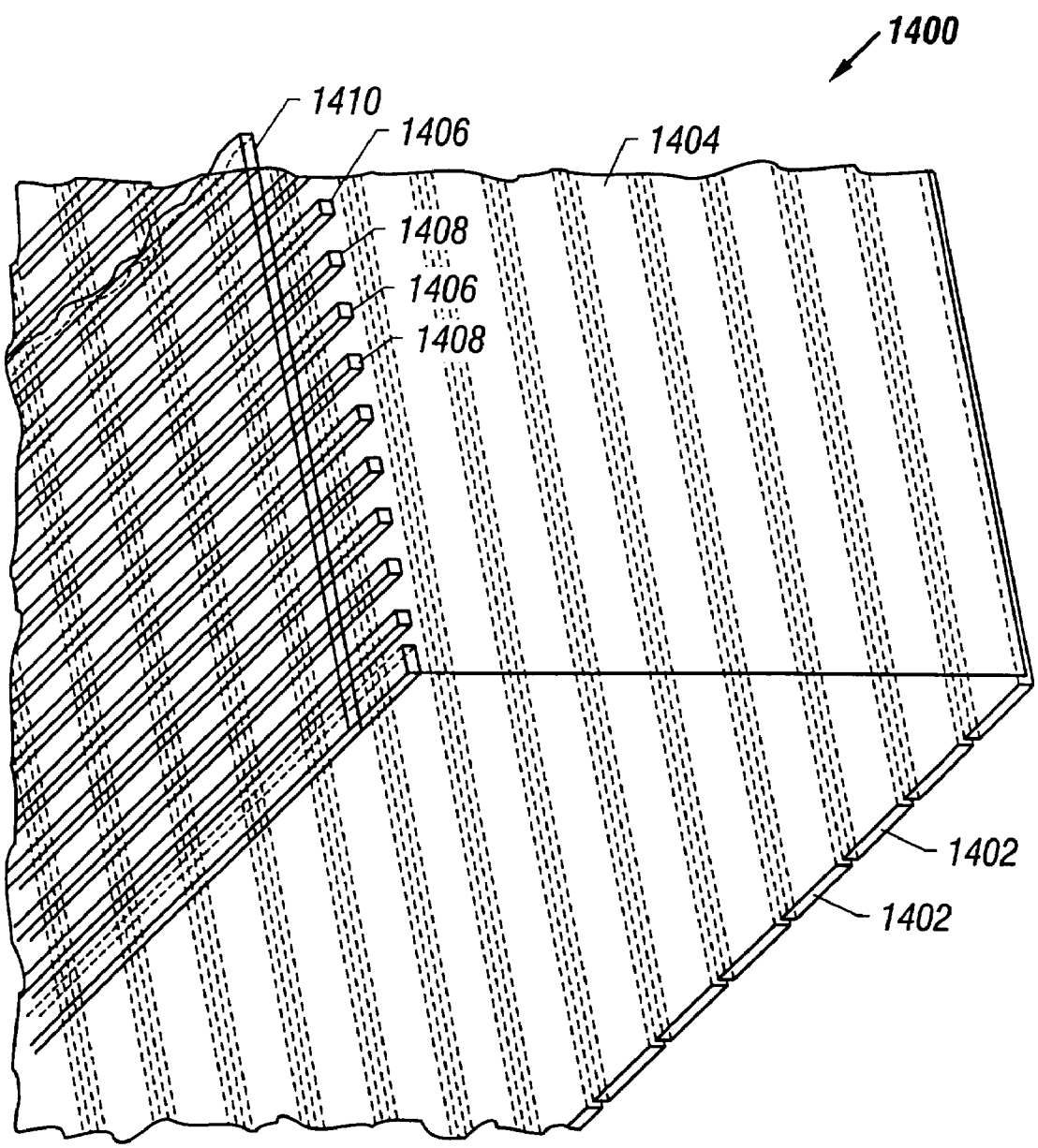
FIG. 14A is a top isometric view of another embodiment of the cross-strip detector of the invention.
Figure 14B:
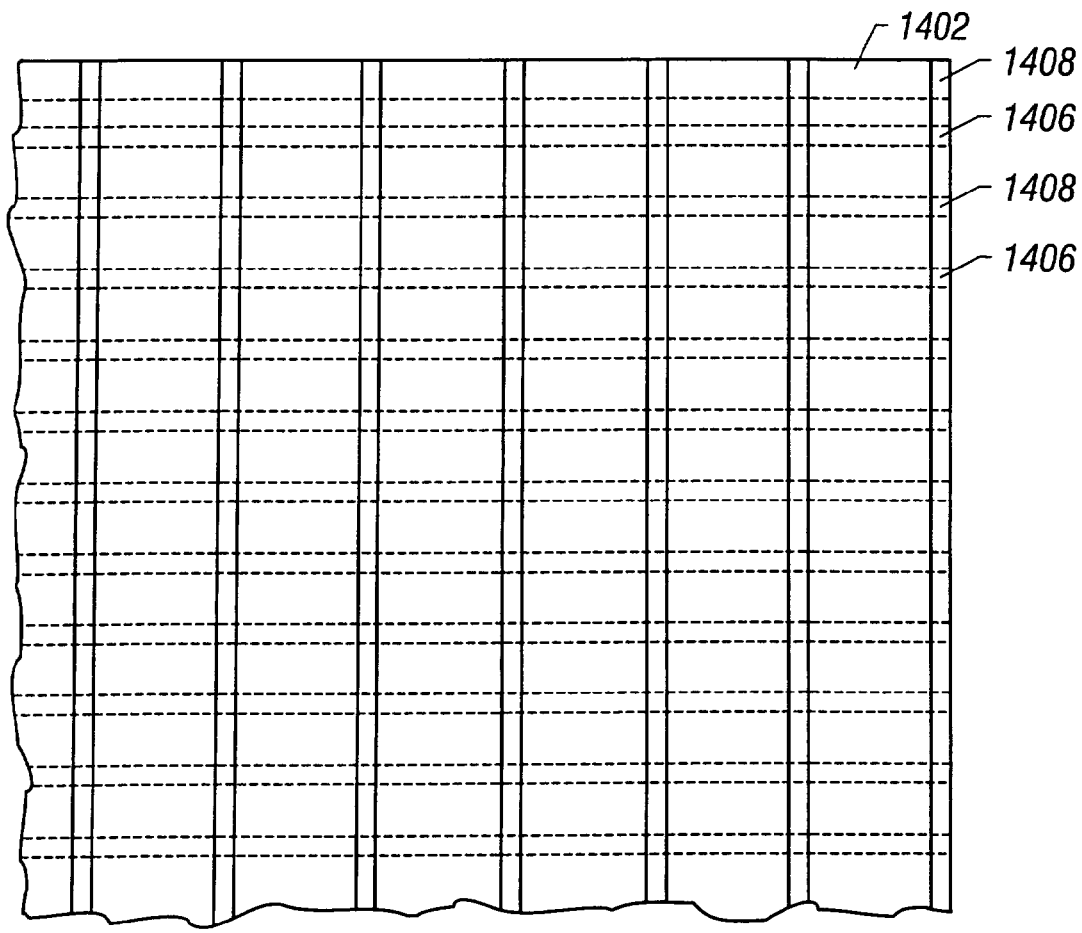
FIG. 14B is a bottom view of the embodiment shown in FIG. 14A.

FIG. 14A is a top isometric view of another embodiment 1400 of the cross-strip detector in accordance with the invention. FIG. 14B is a bottom view of the embodiment 1400. The detector 1400 includes a plurality of parallel cathode strips 1402 on one surface of a semiconductor crystal 1404, and a plurality of alternating or interdigitated anode strips 1406 and control electrode strips 1408 on the opposite surface of the semiconductor crystal 1404, orthogonal to the cathode strips 1402.

In a radiation imaging system, the anode signals from the anode strips 1406 are primarily used to identify both incident radiation energy and the anode strip 1406 on which the electron signal is collected. The cathode signals from the cathode strips 1402 are primarily used to identify the orthogonal position of the radiation interaction. The cathode signals should be large enough to be distinguished above noise levels.

By making the cathode strips 1402 wide and the anode strips 1406 narrow, the relative capacitances from the point of interaction of a radiation event in the detector 1400 to the anode strips 1406 can be minimized and to the cathode strips 1402 can be maximized. This results in an electron charge signal at the anode strips 1406 that has minimum charge loss from trapped holes, and in a hole charge signal at the cathode strips 1402 that is maximized because the trapped-hole charge induced on the anode strips 1406 has been minimized.

As in the embodiments of the invention described above, the control electrode strips 1408 placed between the anode strips 1406 enhance electron collection by the anode strips 1406. The width of the control electrode strips 1408 is kept small for better separation of detection rows. A detection row is the volume of detector material between planes orthogonal to the cathode side of the detector and passing through the center lines of consecutive control electrode strips. Optionally, capacitance on the anode side of the detector for shielding trapped charge from being induced on the anode can be provided by a planar electrode 1410 that is as close as possible to—but insulated from—the surface of the detector. Such a structure is essentially the same as the fourth control electrode 1110 shown in FIG. 11B. The planar electrode may be connected to the control electrodes or to ground directly or through coupling capacitance. In one embodiment, the planar electrode 1410 can be provided with openings through which the anodes 1406, electrically isolated from the planar electrode 1410, can be coupled to measurement circuitry. Alternatively, contacts can be made to the anodes at one end of the anode structures.

The planar-electrode capacitance 1410 facilitates the minimization of anode-signal-charge loss that results from trapped charge, but also reduces somewhat the signal at the cathode strips 1402. However, the benefits from enhancing the anode signal more than offset any disadvantage from degrading the cathode signals.

Preferred embodiments of cross-strip radiation detectors made in accordance with the invention typically follow the following general rules:

1. Anode strips should be as narrow as can be reliably manufactured with high strip conductivity.
2. Cathode strips should be as wide as can be reliably manufactured with good resistance between strips.
3. An interleaved set of control strips on the anode side should be as narrow as can be reliably manufactured.
4. a capacitance plane, tightly coupled to the detector and covering the areas between the anode strips and the control-electrode strips should be reliably connected to the control strips or to circuit ground, either directly or through a coupling capacitance.
5. The control strips should be connected to the control voltage supply with very low resistance to eliminate signal coupling into the anode strips.
6. The anode strips should be connected to preamplifiers with very low resistance to eliminate charge coupling into other electrodes or conductors.
7. The cathode strips should be connected to preamplifiers via a coupling capacitor with very low series resistance.

Multiple cross-strip detectors shown in FIGS. 12A and 14A may be butted side by side to form a larger 1-dimensional or 2-dimensional array. Such large imaging arrays may be used in many applications and in particular medical imaging systems.

Cord-Wood Construction

In conventional cross-strip detectors and the embodiments of FIGS. 12A–12C and FIG. 14A, a two-dimensional measurement is accomplished by simultaneously measuring both the anode signals and the cathode signals. Since cathode strips and anodes are held at different voltages, signals from the high-voltage side need to be decoupled prior to signal processing, or alternatively the processing circuitry needs to operate at the high voltage, which for some applications, may be several thousand volts. High-voltage capacitors are commonly used to decouple the signals from the electrode voltages. However, high-voltage capacitors are physically large in order to prevent voltage breakdown.

Many conventional cross-strip detector arrays based on the former approach have decoupling and amplification electronic circuitry laid out to at least one lateral side of the detector array. This results in an array that can be butted in close proximity to other arrays at most on three lateral sides. Therefore, appreciable dead space is usually formed when multiples of such cross-strip detector arrays are butted with one another side-by-side to form a larger 2-dimensional array.

Figure 15A:
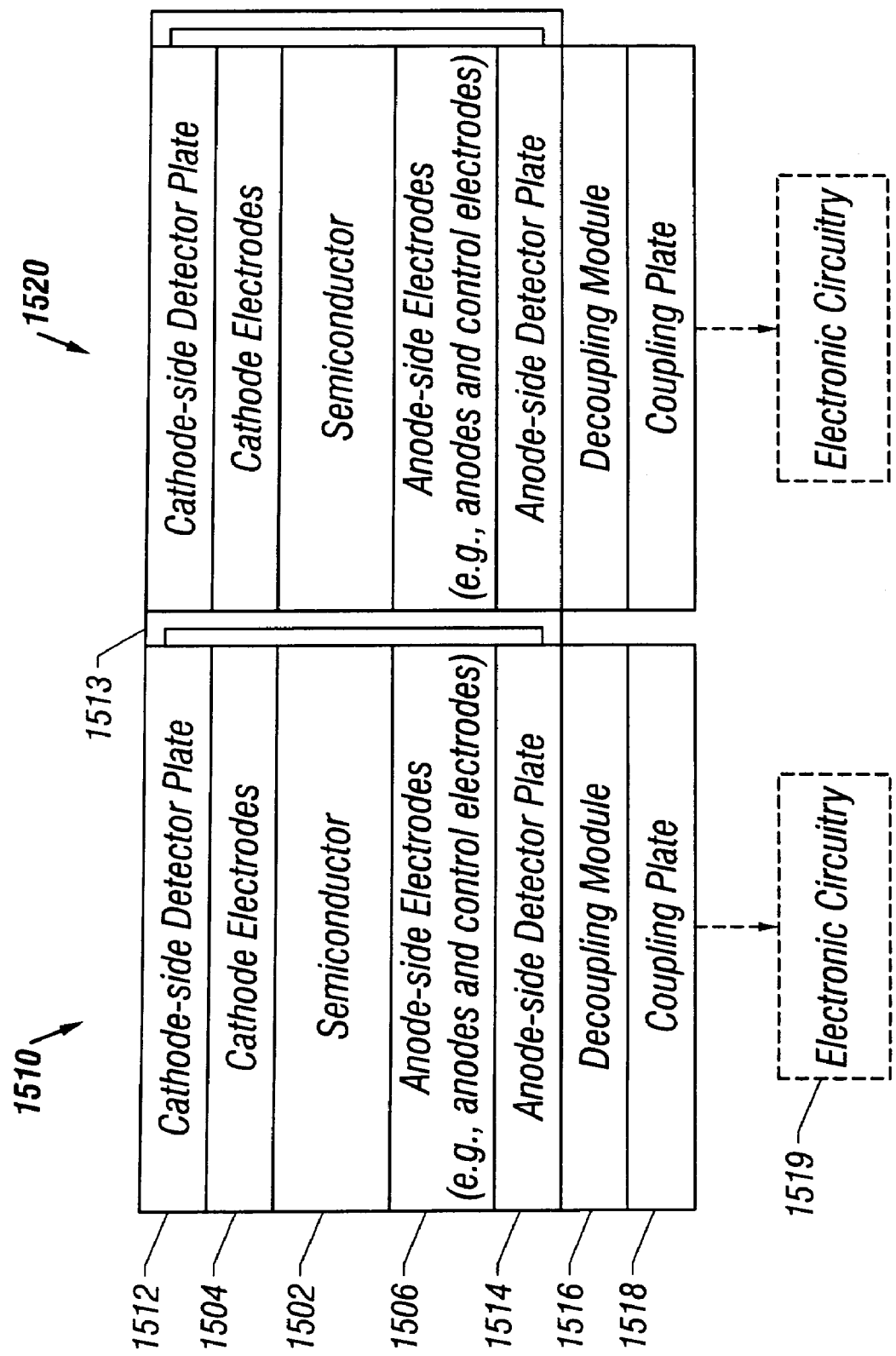
FIG. 15A is a diagram showing one embodiment of the cord-wood construction of a cross-strip detector with all-side buttablility.

FIG. 15A shows one embodiment of a cross-strip detector module 1510 with a "cord-wood" construction in accordance with the invention. A semiconductor crystal 1502 is sandwiched between cathode columns 1504 on one surface and anode rows 1506 on the opposite surface. The cathode columns 1540 are not parallel to the anode rows 1506 and are preferably mutually orthogonal. The configuration of the cathode columns 1504 and anode rows 1506 may be similar to the conventional cross-strip detectors or the embodiments of FIGS. 12A–12C and FIG. 14A in which other anode-side electrodes such as control electrodes or shielding electrodes may be formed relative to the anode electrodes.

A cathode-side detector plate 1512 may be formed over the cathode strips 1504 to provide electrical connection to the cathode strips 1504 for applying a bias voltage $V_b$ and for exporting the cathode signals. Each cathode strip may be connected to $V_b$ through a large-value resistor. Similarly, an anode-side detector plate 1514 may be formed over the anode-row array 1506 to provide electrical connection to the anode electrode rows 1506 for applying a voltage reference $V_a$ and for exporting the anode signals. Each anode row may be connected to $V_a$ with a large-value resistor.

The difference between the bias voltage $V_b$ and the voltage reference $V_a$ is usually a large negative voltage, for example, from several tens of volts to several thousands of volts, to produce a bias electric field in the semiconductor 1510. The bias electric field causes the radiation-induced holes and electrons to drift to the respective electrodes. The bias voltage $V_b$ may be set at a large negative voltage, with the voltage reference $V_a$ at or near the ground potential. Alternatively, the bias voltage $V_b$ may be at ground potential with $V_a$ at some high positive voltage. Signal-conditioning circuitry 1519, configured to receive and process signals from the electrode strips, is commonly operated referenced to ground potential. The signals are coupled into the circuitry 1519 from each anode and from each cathode strip with capacitors. Voltage ratings of the capacitors must be adequate for the potential of the electrode strips to which they are connected. The resistors and low-voltage capacitors can be made very small using thin- or thick-film technology and may be formed on one or more circuit layers.

High-voltage coupling capacitors are preferably assembled in a cord-wood style in a decoupling circuit 1516 formed over the anode-side detector plate 1514. The high-voltage electrodes of the coupling capacitors are connected at one surface of the circuit 1516 adjacent to the anode-side detector plate 1514 and the low-voltage electrodes of the coupling capacitors are connected at the opposite surface. The detector module 1510 may also include a coupling plate 1518 over the decoupling circuit 1516 for routing signals to the circuitry 1519. The thickness of the decoupling circuit 1516 is largely determined by the thickness of the decoupling capacitors that are required for the magnitude of the high voltage. All circuitry can be assembled within the perimeter of the detector, thus allowing all-side buttability of detection modules to achieve substantially continuous detection of radiation over a large active detection area in all directions. FIG. 15A further shows two cross-strip detector modules 1510 and 1520 that are butted side by side.

Signals from the low-voltage electrodes of the capacitors (i.e., both high-voltage and low-voltage decoupling capacitors) can be routed to the electronic circuitry 1519 by the most convenient means. The electronic circuitry 1519 may be an integrated part of the cross-strip detector module 1510 or separate, such as, a separate module or separate circuitry on a substrate or motherboard on which the detector module 1510 is mounted.

Signals from the radiation side of the detector module 1510 can be routed to the signal collecting side of the detector by thin conductors 1513 that are insulated from each other and from other surfaces by thin dielectric insulation material. A thin printed circuit with insulating outer layers may be used for this purpose, which may be directly formed on a lateral side of the semiconductor that intersects the radiation and signal collecting sides. If the signals from the radiation side are superimposed on a high voltage, the dielectric insulation material is preferably a type with high dielectric strength such as KAPTON. The cathode strips are commonly on the radiation side of the detector because of the mobility-lifetime product for electrons of many semiconductors is typically much greater than for holes. If the reverse were true, the anode rows might be on the radiation side of the detector. In either case, the radiation side of the detector may be at a high voltage potential or at ground potential, depending on the potential of the signal collecting side of the detector.

The total thickness of the conductors 1513 with insulation material and the manufacturing tolerances of the detector assembly determines the minimum dead space between butted detectors (e.g., on the order of tens of microns). By eliminating the high-voltage coupling capacitors from the lateral side of the detector through using the cord-wood structure, the dead space is significantly reduced. This configuration allows for mounting multiple detectors in close proximity on all lateral sides to form a substantially continuous active area.

Figure 15B:
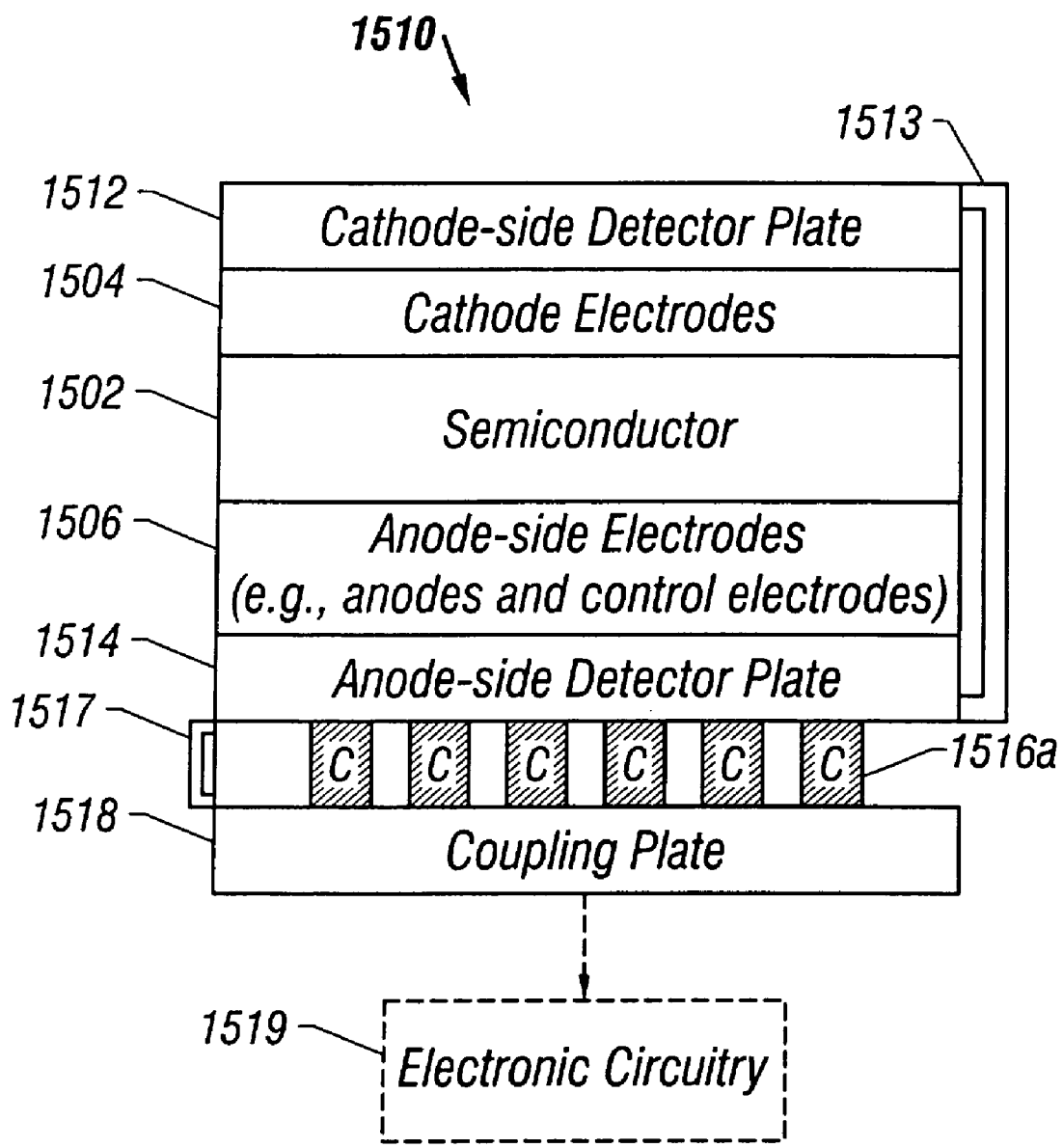
FIG. 15B is a diagram showing one implementation of the cord-wood cross-strip detector of FIG. 15A.

FIG. 15B shows an example of the cord-wood cross-strip detector 1510. High-voltage capacitors 1516A are mounted between the anode-side detector plate 1514 and the coupling plate 1518. Each capacitor 1516A is electrically connected to the anode side detector plate 1514 with one terminal and to the coupling plate 1518 with another terminal. A thin printed circuit 1517 similar to 1513 is used to connect the anode-side detector plate 1514 and the coupling plate 1518.

Side-Entry Radiation Detector

Figure 16:
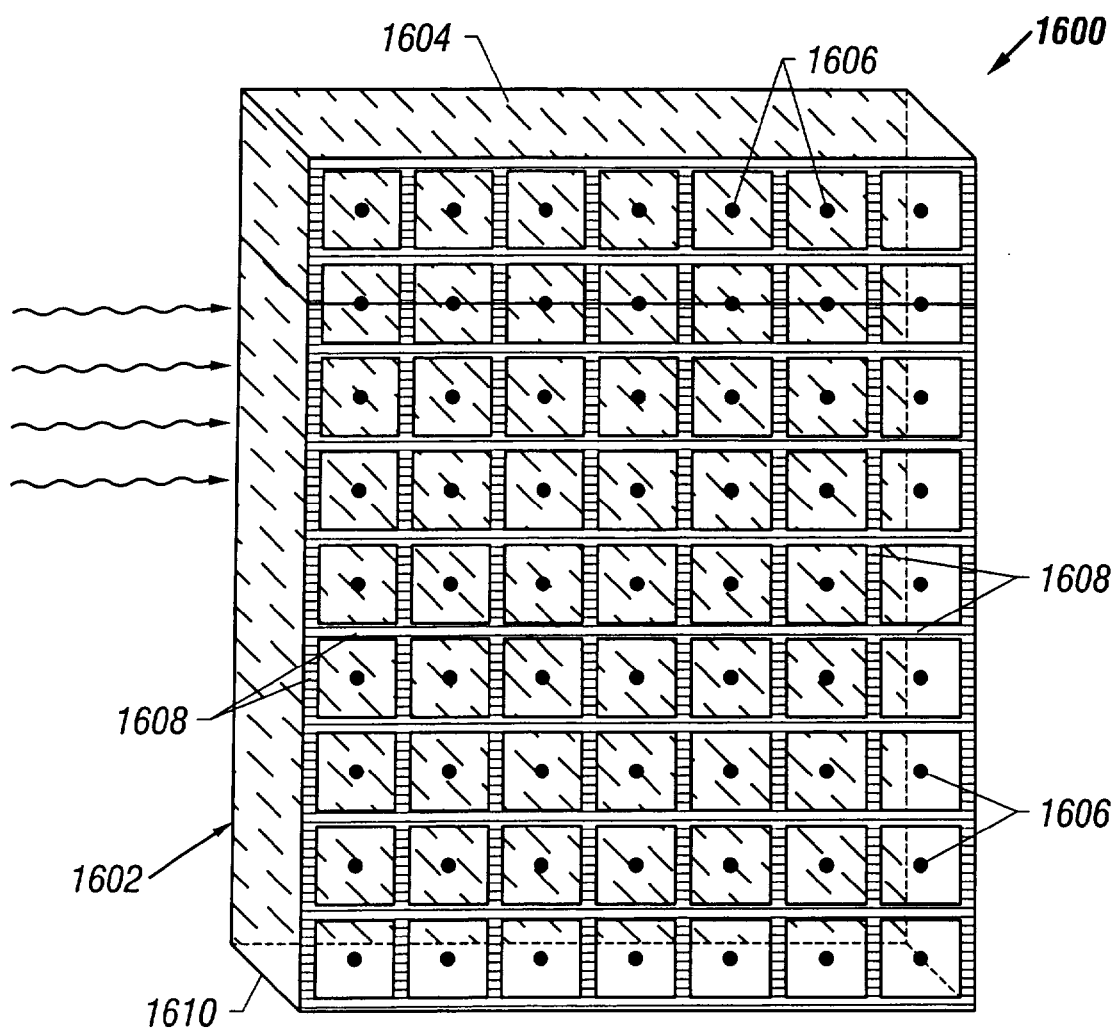
FIG. 16 is a perspective view of an alternative embodiment of the invention showing a side-entry radiation detector array structure.

FIG. 16 is a perspective view of an alternative embodiment of the invention showing a side-entry radiation detector array structure. In this embodiment, the radiation enters the detector 1600 from an "illumination" side 1602, parallel to the cathode 1604 surface and anode 1606/control electrode 1608 surface, rather than through the cathode 1604. This configuration allows high detection efficiency of high energy gamma rays while permitting dimensions from anode 1606 to cathode 1604 that are smaller than would be otherwise required for such high energy gamma rays. For example, the anode-to-cathode thickness for the embodiment shown in FIGS. 12A–C, 14A and 15 required to absorb very high energy gamma rays may require a bias voltage sufficiently high so as to cause pulse breakdown noise to be generated between conductors, or the thickness may be so great that electron-charge trapping may significantly degrade energy resolution. However, by using a side-entry embodiment, any desired depth of penetration can be achieved while allowing an optimum anode-to-cathode thickness.

The signals at the anodes 1606 can be individually measured by electronic circuitry, or the anodes 1606 can be tied together to form a detection element with a larger detection area. If the anodes 1606 are connected together in the direction of the incoming radiation, all of the events collected by a group of anodes 1606 can be measured with a single channel of electronics.

Another advantage of the side-entry radiation detector array structure is that when the anodes 1606 are measured individually or are connected together in a pattern orthogonal to the direction of the incoming radiation, the depth of interaction of the radiation within the semiconductor crystal 1610 can also be measured. As noted above in discussing measuring depth of interaction using timing information, measurement of depth of interaction is important for such applications as image reconstruction with coded masks or positron emission tomography.

Imaging System with A Cord-Wood Cross-Strip Detector Array

The cord-wood structure shown in FIGS. 15A and 15B may be implemented with a variety of cross-strip detectors, including the conventional cross-strip detectors and the cross-strip detectors shown in FIGS. 12A–14B. Multiples of cord-wood cross-strip detectors can be used to form a large detector array in a radiation imaging system.

Figure 17A:
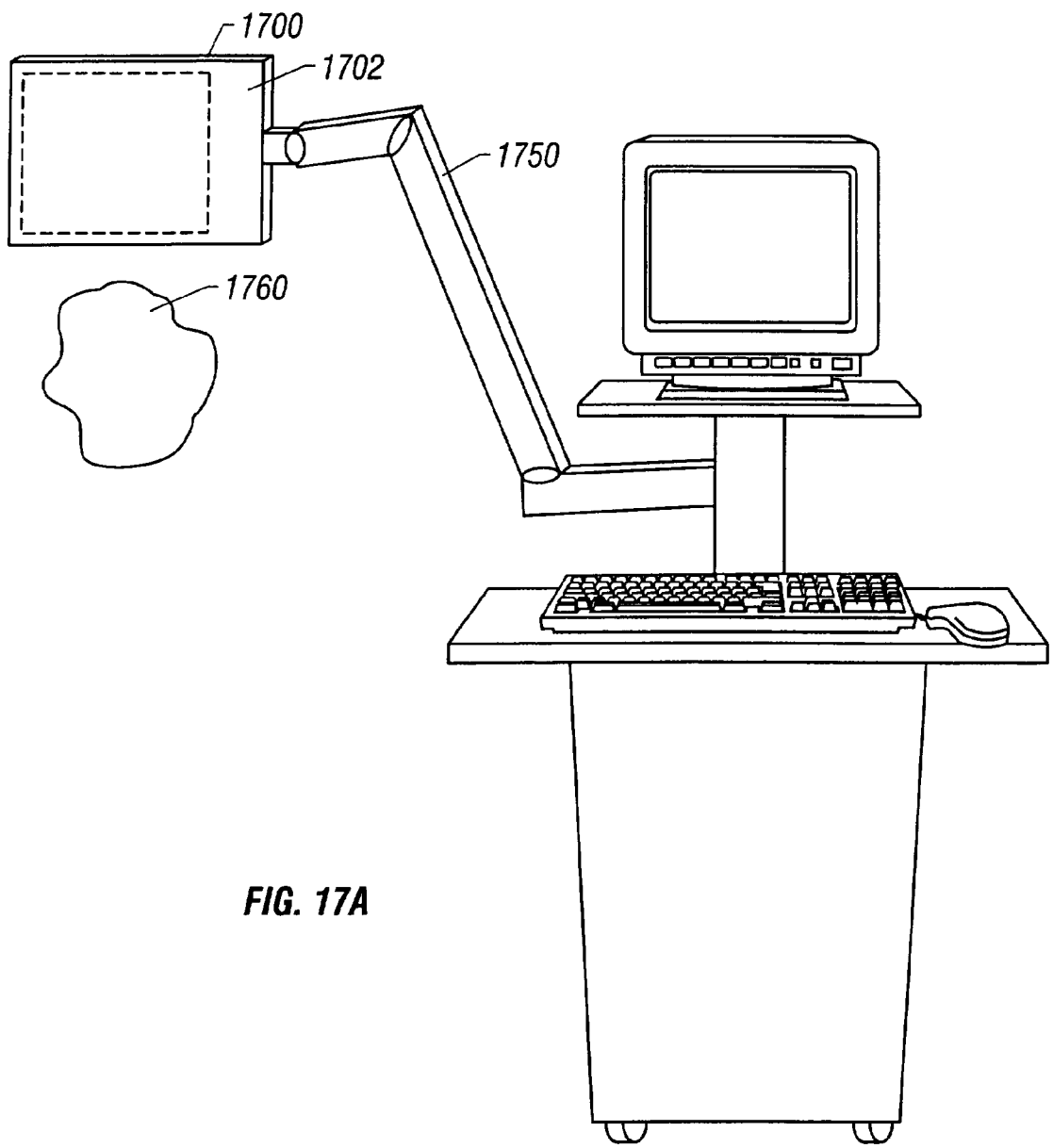
FIG. 17A is a perspective view of an imaging system using a coplanar cross-strip detector array.
Figure 17B:
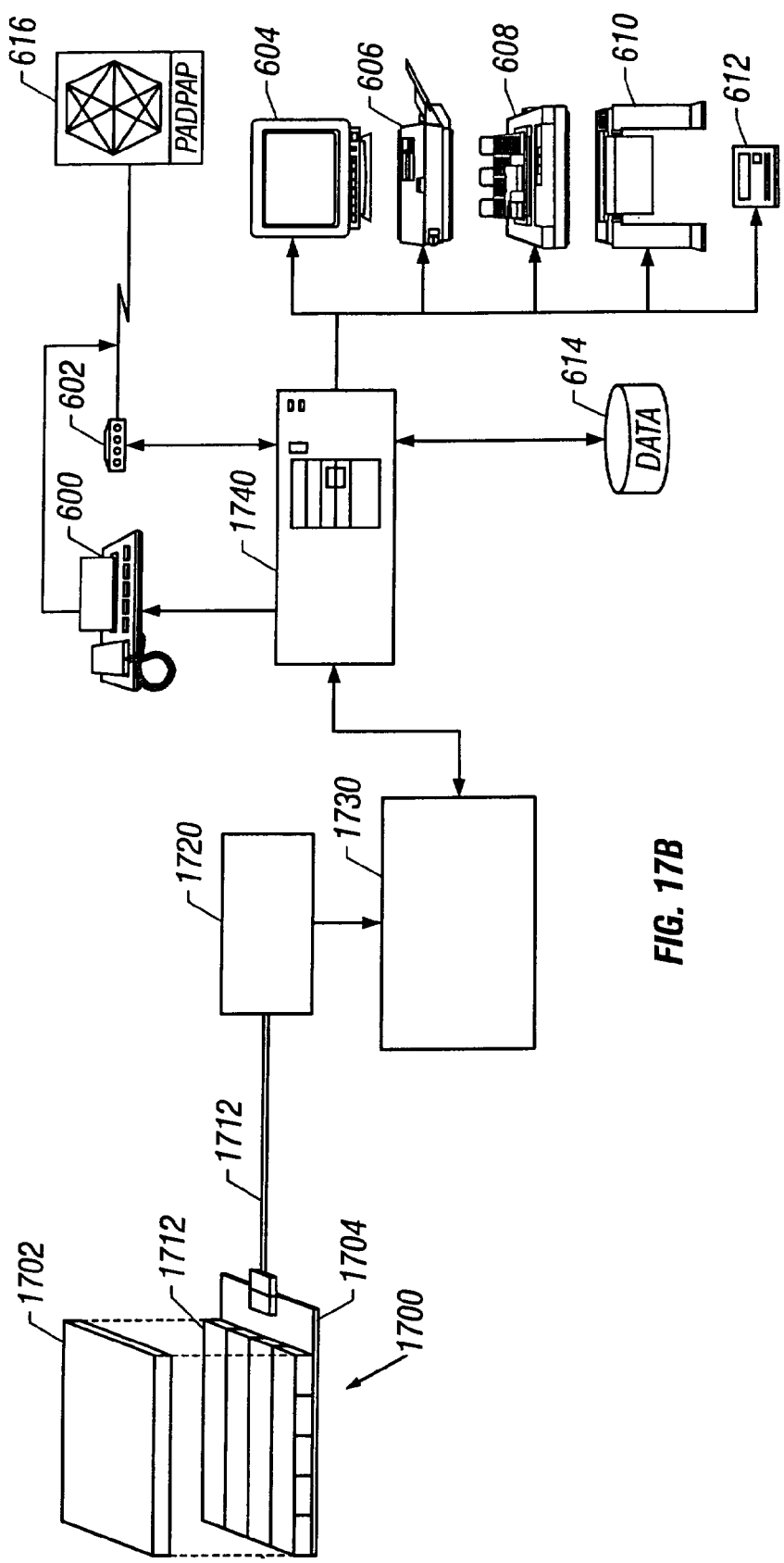
FIG. 17B is a diagram showing one implementation of the imaging system in FIG. 17A.

FIGS. 17A and 17B show one embodiment of a radiation imaging system based on a cord-wood cross-strip detector array. The system comprises a gamma-ray detector 1700, an entrance aperture such as a collimator or pinhole 1702 for directing the gamma rays to the detector, a signal processor 1720, a data acquisition computer 1730, an image processing computer system 1740, and a gantry 1750 for positioning the detector 1700 adjacent to a patient, an organ, or other object 1760. The detector 1700 is used to sense radiation emitted from the object 1760. The signals generated by the detector 1700 are transmitted to the signal processor 1720 using any convenient means, preferably a digital communications link 1712. As shown in FIG. 17B, the imaging system may also include input/output devices for transmitting and displaying derived images of the object 1760 to both on-site and remote users. Various aspects of this imaging system are disclosed in U.S. patent application Ser. No. 08/672,831, filed on Jun. 28, 1996, now U.S. Pat. No. 5,786,597 which is incorporated herein by reference.

The detector 1700 comprises a one-dimensional or two-dimensional array of closely-packed detection module 1710 mounted upon a module board 1704. Each module 1710 is a cord-wood cross-strip detector as shown in FIG. 15A. Preferably, two adjacent modules are butted to each other in a way that only one printed circuit connecting the cathode-side detector plate and the anode-side detector plate is between the modules. A column and row addressing circuit may be implemented within the detector 1700. The module board 1708 routes the signals generated by the detection modules 1710 to the signal processor 1720.

Although the present invention has been described in detail with reference to a number of embodiments, one ordinarily skilled in the art to which this invention pertains will appreciate that various modifications and enhancements may be predictable without departing from the scope of the appended claims.

What is claimed is:

1. A cross-strip radiation detector, comprising:
   (a) a semiconductor having a plurality of sides and of sufficient thickness to interact with ionizing radiation;
   (b) at least one independent radiation-side strip electrode formed on a radiation side of the semiconductor and maintained at a first bias voltage;
   (c) a plurality of signal-collecting-side electrodes formed on a signal collecting side of the semiconductor opposing the radiation side and intercoupled as at least two independent signal-collecting-side signal strips effectively forming an angle with respect to the radiation-side strip electrode, each signal-collecting-side signal strip including one or more electrically coupled signal-collecting-side electrodes and being set at a second bias voltage, wherein at least one of the first and second bias voltages is at a high voltage with respect to the ground level;
   (d) a high-voltage decoupling circuit having an array of high-voltage capacitors formed over the plurality of signal-collecting-side electrodes within the perimeter of the signal collecting side, the high-voltage decoupling circuit connected to the electrodes at the high voltage to receive and decouple signals that are superimposed on the high voltage and are indicative of the ionizing radiation; and
   (e) at least one electrical conductor that interconnects the radiation side and the signal collecting side to transfer a signal from the radiation side to the signal collecting side.

2. The cross-strip radiation detector of claim 1, further comprising a first circuit layer formed between the signal-collecting-side electrodes and the high-voltage decoupling circuit and second circuit layer formed over the high-voltage decoupling circuit, wherein each high-voltage capacitor of the high-voltage decoupling circuit is connected to the first circuit layer at one terminal and to the second circuit layer at the other terminal and the spacing between the first and the second circuit layers is configured to accommodate the high voltage.

3. The cross-strip radiation detector of claim 1, further comprising an electronic circuit which is configured to receive and process signals from the radiation side and the signal collecting side to measure an ionizing event, wherein the electronic circuit is operable to determine a position of the ionizing event according to signals on the radiation side and the signal collecting side electrodes.

4. The cross-strip radiation detector of claim 1, wherein the electrical conductor is a conductor within a printed circuit which is interposed between two insulating dielectric layers.

5. The cross-strip radiation detector of claim 4, wherein the printed circuit is at least in part formed on a lateral side of the semiconductor which intersects the radiation side and signal collecting side.

6. The cross-strip radiation detector of claim 1, further comprising at least one control electrode, formed on the signal collecting side of the semiconductor and electrically insulated from the signal electrodes, the control electrode having a geometry and control potential to affect the charge collection of the signal-collecting-side electrodes.

7. The cross-strip radiation detector of claim 6, wherein the control potential of the control electrode is within a range between the first bias voltage and the second bias voltage and effects a guiding force that drives charge towards the signal-collecting-side electrodes.

8. The cross-strip radiation detector of claim 6, wherein the geometry of the control electrode effects a shielding to the signal-collecting-side electrodes and substantially reduces induced charge on the signal-collecting-side electrodes caused by charge trapping in the semiconductor.

9. The cross-strip radiation detector of claim 1, further comprising a shield electrode which is a continuous conducting layer overlapping the signal-collecting-side electrodes and defining an array of openings to allow access to the signal-collecting-side electrodes, wherein the shield electrode is insulated from other electrodes and the semiconductor and is capacitively coupled to the semiconductor to reduce induced charge on the signal-collecting-side electrodes.

10. A cross-strip radiation detector, comprising:
(a) a semiconductor having a plurality of sides which include a radiation side and an opposing signal collecting side and a sufficient thickness between the radiation side and the signal collecting side to interact with ionizing radiation;
(b) at least one independent radiation-side strip electrode formed on the radiation side of the semiconductor and maintained at a first bias voltage;
(c) a plurality of independent and parallel signal-collecting-side strip signal electrodes that are formed on the signal collecting side of the semiconductor and effectively form an angle with respect to the radiation-side strip electrode, the signal-collecting-side strip signal electrodes being set at a second bias voltage, wherein at least one of the first and second bias voltages is at a high voltage with respect to the ground level;
(d) a high-voltage decoupling circuit having an array of high-voltage capacitors formed over the plurality of signal-collecting-side strip signal electrodes within the perimeter of the signal collecting side, the high-voltage decoupling circuit connected to the electrodes at the high voltage to receive and decouple signals that are superimposed on the high voltage and are indicative of the ionizing radiation; and
(e) at least one electrical conductor that interconnects the radiation side and the signal collecting side to transfer a signal from the radiation side to the signal collecting side.

11. The cross-strip radiation detector of claim 10, further comprising a first circuit layer formed between the signal-collecting-side stip signal electrodes and the high-voltage decoupling circuit and second circuit layer formed over the high-voltage decoupling circuit, wherein each high-voltage capacitor of the high-voltage decoupling circuit is connected to the first circuit layer at one terminal and to the second circuit layer at the other terminal and the spacing between the first and the second circuit layers is configured to accommodate the high voltage.

12. The cross-strip radiation detector of claim 10, wherein the electrical conductor is a conductor within a printed circuit which is interposed between two insulating dielectric layers.

13. The cross-strip radiation detector of claim 12, wherein the printed circuit is at least in part formed on a lateral side of the semiconductor which intersects the radiation side and signal collecting side.

14. The cross-strip radiation detector for claim 10, further comprising a plurality of parallel strip control electrodes, formed on the signal collecting side of the semiconductor near and interdigitated with the signal-collecting-side strip signal electrodes and electrically insulated from the signal-collecting-side strip signal electrodes, the parallel strip control electrodes operable to perform at least one of the functions of (A) directing charge clouds resulting from ionizing events in the semiconductor towards the signal-collecting-side strip signal electrodes and (B) substantially reducing the effect on the signal-collecting-side strip signal electrodes of charge trapping in the semiconductor.

15. The cross-strip radiation detector of claim 10, further comprising an electronic circuit which is configured to receive and process signals from the radiation side and the signal collecting side to measure an ionizing event, wherein the electronic circuit is operable to determine a position of the ionizing event according to signals on the radiation side and the signal collecting side electrodes.

16. A radiation imaging device, comprising a plurality of detector modules arranged relative to one another side-by-side to form a detector array, each detector module comprising:
(1) a semiconductor having a plurality of sides and of sufficient thickness to interact with ionizing radiation;
(2) at least one independent radiation-side strip electrode formed on a radiation side of the semiconductor and maintained at a first bias voltage;
(3) a plurality of signal-collecting-side electrodes formed on a signal collecting side of the semiconductor opposing the radiation side and intercoupled as at least two independent signal-collecting-side signal strips effectively forming an angle with respect to the radiation-side strip electrode, each signal-collecting-side signal strip including one or more electrically coupled signal-collecting-side electrodes and being set at a second bias voltage, wherein at least one of the first and second bias voltages is at a high voltage with respect to the ground level;

(4) a high-voltage decoupling circuit having an array of high-voltage capacitors formed over the plurality of signal-collecting-side electrodes within the perimeter of the signal collecting side, the high-voltage decoupling circuit connected to the electrodes at the high voltage to receive and decouple signals that are superimposed on the high voltage and are indicative of the ionizing radiation; and (5) at least one electrical conductor that interconnects the radiation side and the signal collecting side to transfer a signal from the radiation side to the signal collecting side.

17. The cross-strip radiation detector of claim 16, wherein each detector module further comprises a first circuit layer formed between the signal-collecting-side electrodes and the high-voltage decoupling circuit and second circuit layer formed over the high-voltage decoupling circuit, wherein each high-voltage capacitor of the high-voltage decoupling circuit is connected to the first circuit layer at one terminal and to the second circuit layer at the other terminal and the spacing between the first and the second circuit layers is configured to accommodate the high voltage.

18. The imaging device of claim 16, further comprising a signal processor which receives and processes signals from the detector array to form an electronic image representation of the ionizing radiation.

19. The cross-strip radiation detector for claim 16, wherein each detector module further comprises a plurality of parallel strip control electrodes, formed on the signal collecting side of the semiconductor near and interdigitated with the signal-collecting-side electrodes and electrically insulated from the signal-collecting-side electrodes, the parallel strip control electrodes operable to perform at least one of the functions of (A) directing charge clouds resulting from ionizing events in the semiconductor towards the signal-collecting-side electrodes and (B) substantially reducing the effect on the signal-collecting-side electrodes of charge trapping in the semiconductor.

20. A radiation imaging device, comprising a plurality of detector modules arranged relative to one another side-by-side to form a detector array, each detector module comprising:

(1) a semiconductor having a plurality of sides which include a radiation side and an opposing signal collecting side and a sufficient thickness between the radiation side and the signal collecting side to interact with ionizing radiation;

(2) at least one independent radiation-side strip electrode formed on the radiation side of the semiconductor and maintained at a first bias voltage;

(3) a plurality of independent and parallel signal-collecting-side strip signal electrodes that are formed on the signal collecting side of the semiconductor and effectively form an angle with respect to the radiation-side strip electrode, the signal-collecting-side strip signal electrodes being set at a second bias voltage, wherein at least one of the first and second bias voltages is at a high voltage with respect to the ground level;

(4) a high-voltage decoupling circuit having an array of high-voltage capacitors formed over the plurality of signal-collecting-side strip signal electrodes within the perimeter of the signal collecting side, the high-voltage decoupling circuit connected to the electrodes at the high voltage to receive and decouple signals that are superimposed on the high voltage and are indicative of the ionizing radiation; and (5) at least one electrical conductor that interconnects the radiation side and the signal collecting side to transfer a signal from the radiation side to the signal collecting side.

21. The cross-strip radiation detector of claim 20, wherein each detector module further comprises a first circuit layer formed between the signal-collecting-side strip signal electrodes and the high-voltage decoupling circuit and second circuit layer formed over the high-voltage decoupling circuit, wherein each high-voltage capacitor of the high-voltage decoupling circuit is connected to the first circuit layer at one terminal and to the second circuit layer at the other terminal and the spacing between the first and the second circuit layers is configured to accommodate the high voltage.

22. The imaging device of claim 16, further comprising a signal processor which receives and processes signals from the detector array to form an electronic image representation of the ionizing radiation.

23. The cross-strip radiation detector for claim 16, wherein each detector module further comprises a plurality of parallel strip control electrodes, formed on the signal collecting side of the semiconductor near and interdigitated with the signal-collecting-side electrodes and electrically insulated from the signal-collecting-side electrodes, the parallel strip control electrodes operable to perform at least one of the functions of (A) directing charge clouds resulting from ionizing events in the semiconductor towards the signal-collecting-side electrodes and (B) substantially reducing the effect on the signal-collecting-side electrodes of charge trapping in the semiconductor.

* * * * *